United States Patent
Katsurayama et al.

(10) Patent No.: US 8,319,350 B2
(45) Date of Patent: Nov. 27, 2012

(54) ADHESIVE TAPE AND SEMICONDUCTOR DEVICE USING THE SAME

(75) Inventors: Satoru Katsurayama, Tokyo (JP); Tomoe Yamashiro, Tokyo (JP); Takashi Hirano, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 567 days.

(21) Appl. No.: 12/447,657

(22) PCT Filed: Oct. 30, 2007

(86) PCT No.: PCT/JP2007/071454
§ 371 (c)(1), (2), (4) Date: Nov. 25, 2009

(87) PCT Pub. No.: WO2008/054012
PCT Pub. Date: May 8, 2008

(65) Prior Publication Data
US 2010/0078830 A1  Apr. 1, 2010

(30) Foreign Application Priority Data

Oct. 31, 2006  (JP) ................... 2006-295545
Feb. 1, 2007  (JP) ................... 2007-023020

(51) Int. Cl.
*H01L 25/065*  (2006.01)

(52) U.S. Cl. .. 257/777; 257/779; 257/686; 257/E25.013

(58) Field of Classification Search ............... 257/777, 257/778, 673, 686, E25.013, E25.018, 773, 257/783, 779
See application file for complete search history.

(56) References Cited

U.S. PATENT DOCUMENTS

| | | | | |
|---|---|---|---|---|
| 6,121,689 A * | 9/2000 | Capote et al. | ............ | 257/783 |
| 6,492,438 B1 | 12/2002 | Nomura | | |
| 6,692,611 B2 * | 2/2004 | Oxman et al. | ............ | 156/275.5 |

FOREIGN PATENT DOCUMENTS

| | | |
|---|---|---|
| EP | 2011844 | 1/2009 |
| EP | 2012358 | 1/2009 |
| EP | 2071000 | 6/2009 |
| JP | 61-276873 | 12/1986 |
| JP | 2001-049082 | 2/2001 |
| JP | 2003-103398 | 4/2003 |
| JP | 2003-231876 | 8/2003 |

(Continued)

OTHER PUBLICATIONS

Machine English Translation of Japanese Patent JP 2004-244486 by Tatsuhiro dated Feb. 9, 2004.*

(Continued)

*Primary Examiner* — Thinh T Nguyen
(74) *Attorney, Agent, or Firm* — Ditthavong Mori & Steiner, P.C.

(57) ABSTRACT

The present invention relates to an adhesive tape for electrically connecting semiconductor chips in a chip-on-chip type semiconductor device. The adhesive tape comprising: (A) 10 to 50 wt % of film forming resin; (B) 30 to 80 wt % of curable resin; and (C) 1 to 20 wt % of curing agent having flux activity.

8 Claims, 8 Drawing Sheets

FOREIGN PATENT DOCUMENTS

| | | |
|---|---|---|
| JP | 2003-264205 | 9/2003 |
| JP | 2004-174574 | 6/2004 |
| JP | 2004-244486 | 9/2004 |
| JP | 3769688 | 9/2004 |
| JP | 2004-296917 | 10/2004 |
| JP | 2005-44989 | 2/2005 |
| JP | 2006-143795 | 6/2006 |

OTHER PUBLICATIONS

Machine English Translation of Japanese Patent JP 2003-103398 by Nakamura dated Aug. 4, 2003.*
Extended European Search Report for corresponding EP Application No. 07831187.5-2203, Mar. 8, 2011.

* cited by examiner (a)

(b)

(c)

ADHESIVE TAPE AND SEMICONDUCTOR DEVICE USING THE SAME

TECHNICAL FIELD

The present invention relates to an adhesive tape and a semiconductor device using the same. More specifically, the present invention relates to an adhesive tape, which is used for electrical connection between semiconductor chips in a chip-on-chip type semiconductor device which can meet the requirements for density increase of semiconductor integrated circuits, and a semiconductor device using the same.

BACKGROUND ART

Recently, as the need for sophistication and miniaturization of electronic devices has been increased, the technique for high-density package of semiconductor integrated circuits has been developed. One example of such packaging techniques is a chip-on-chip type System in Package (SiP) in which a semiconductor chip is mounted on another semiconductor chip face down. Attention is focused on this structure because it allows thickness reduction of packages and is excellent in reliability of electrical connection.

In a chip-on-chip type SiP, connection between semiconductor chips is provided via fine bumps according to a flip-chip method. In this case, in order to ensure electrical connection strength and mechanical connection strength, a filling resin is injected into the position between the semiconductor chips (underfill filling). However, in this step of underfill filling, the filling resin injected between the semiconductor chips bleeds and an external electrode provided on the surface of the lower semiconductor chip is contaminated thereby, and for this reason, there is a problem that it is impossible to perform wire bonding.

Methods in which electrical connection and filling between terminals are performed together via an anisotropic conductive film are also known. For example, Japanese Laid-Open Patent Publication No. 61-276873 (Patent Document 1) describes an adhesive tape including solder particles. The document describes a method in which the adhesive tape is interposed between members to be subjected to thermocompression bonding, and thereby solder particles are interposed between electrical connection portions of the members and other portions are filled with a resin component. Further, Japanese Patent No. 3769688 (Patent Document 2) describes a method of connecting terminals using an electrically conductive adhesive including electrically conductive particles and a resin component which is not completely cured at the meting point of the electrically conductive particles.

However, even if these methods are used, it is difficult to ensure electrical connection reliability between semiconductor chips and ion migration resistance of resin after filling. For this reason, none of these methods realized further improvement of density increase of semiconductor integrated circuits in chip-on-chip type SiPs.

DISCLOSURE OF THE INVENTION

Under the above-described circumstances, the development of an adhesive tape, which can ensure electrical connection reliability and ion migration resistance after curing resin in a chip-on-chip type SiP (also referred to as "chip-on-chip type semiconductor device"), and by using which electrical connection and filling between semiconductor chips can be performed together, is desired. In addition, the development of a semiconductor device which can meet the requirements for further density increase of semiconductor integrated circuits is desired.

The present inventors diligently made researches in order to solve the above-described problems, and found that an adhesive tape, which can be used to perform electrical connection and filling between semiconductor chips together in a chip-on-chip type semiconductor device, and which is excellent in properties such as electrical connection reliability and ion migration resistance after curing resin, can be obtained by mixing a film forming resin component and a curable resin component in a specific composition and by further blending a curing agent having flux activity, and thus the present invention was achieved.

That is, the present invention provides an adhesive tape, a semiconductor device, etc. as follows:

[1] An adhesive tape for electrically connecting semiconductor chips in a chip-on-chip type semiconductor device, comprising:
(A) 10 to 50 wt % of film forming resin;
(B) 30 to 80 wt % of curable resin; and
(C) 1 to 20 wt % of curing agent having flux activity.

[2] An adhesive tape for electrically connecting a first semiconductor chip and a second semiconductor chip in a chip-on-chip type semiconductor device, wherein the circuit surface of the first semiconductor chip and the circuit surface of the second semiconductor chip are opposed to each other, the adhesive tape comprising:
(A) 10 to 50 wt % of film forming resin;
(B) 30 to 80 wt % of curable resin; and
(C) 1 to 20 wt % of curing agent having flux activity.

[3] The adhesive tape according to item [1] or [2], wherein the film forming resin is at least one substance selected from the group consisting of (meth)acrylic resin, phenoxy resin and polyimide resin.

[4] The adhesive tape according to any one of items [1] to [3], wherein the curable resin is epoxy resin.

[5] The adhesive tape according to any one of items [1] to [4], wherein the curing agent having flux activity is at least one substance selected from the group consisting of aliphatic dicarboxylic acid and a compound having a carboxyl group and a phenolic hydroxyl group.

[6] The adhesive tape according to item [5], wherein the aliphatic dicarboxylic acid is sebacic acid.

[7] The adhesive tape according to item [5], wherein the compound having a carboxyl group and a phenolic hydroxyl group is at least one substance selected from phenolphthalin and gentisic acid.

[8] The adhesive tape according to any one of items [1] to [7], wherein, in the case where a tin-containing solder ball having the diameter of 500 μm is provided on the adhesive tape and heated at a temperature which is 30° C. higher than the melting point of the solder ball for 20 seconds, the solder wet-spreading ratio represented by the following formula (I) is 40% or higher:

$$\text{Solder wet-spreading ratio (\%)} = [\{(\text{diameter of solder ball}) - (\text{thickness of solder after wet spreading})\} / (\text{diameter of solder ball})] \times 100 \quad (I)$$

[9] The adhesive tape according to item [8], wherein, in the case where the solder wet-spreading ratio is 60% or higher, the adhesive tape comprises aliphatic dicarboxylic acid as (C) the curing agent having flux activity.

[10] The adhesive tape according to item [8], wherein, in the case where the solder wet-spreading ratio is 40% to 60%, the adhesive tape comprises the compound having a carboxyl group and a phenolic hydroxyl group as (C) the curing agent having flux activity.

[11] The adhesive tape according to any one of items [1] to [10], wherein, in the case where the thickness of the adhesive tape is 100 μm, the melt viscosity thereof at 223° C. is 10 Pa·s to 200000 Pa·s.

[12] The adhesive tape according to any one of items [1] to [7], which further comprises 30 to 200 parts by weight of solder powder per 100 parts by weight of constituents other than the solder powder.

[13] The adhesive tape according to item [12], wherein, in the case where the thickness of the adhesive tape is 100 μm, the melt viscosity thereof at 138° C. is 1 Pa·s to 10000 Pa·s.

[14] A chip-on-chip type semiconductor device, wherein semiconductor chips are electrically connected using the adhesive tape according to any one of items [1] to [13].

When using the adhesive tape of the present invention, electrical connection and filling between semiconductor chips in a chip-on-chip type semiconductor device can be performed together. In particular, when using a curing agent having flux activity in the adhesive tape of the present invention, an oxidized film on a solder component of a solder bump, solder powder or the like can be removed, and thereby wettability of the solder component can be improved. As a result, electrical connection reliability between semiconductor chips can be ensured. The curing agent having flux activity functions as a curing agent at the time of curing the adhesive tape. Therefore, flux washing is not required. Moreover, since no flux component in the free state exists in a resin component, there is an advantage that good ion migration resistance can be obtained.

According to a preferred embodiment of the present invention, by adjusting the melt viscosity of the adhesive tape in a predetermined range, bleeding of the resin component which occurs at the time of melting the adhesive tape can be minimized. By bonding semiconductor chips together using the adhesive tape of the present invention, the distance between the semiconductor chips can be reduced, and the shortest distance between the side surface of the upper semiconductor chip and an external electrode provided on the lower semiconductor chip can be reduced. As a result, the total thickness of components to be packaged as a semiconductor device can be reduced, and the total weight of the components to be packaged can be reduced. Moreover, by using the adhesive tape of the present invention, the integration density of semiconductor chips, which one package can include, can be increased, and in addition, the whole component to be packaged can be miniaturized. Furthermore, since the shortest distance between internal electrodes provided on the surface of the semiconductor chip can be reduced, the amount of information, which one package can include, can be increased.

Since the integration density of the semiconductor chips, which one package can include, can be increased in the semiconductor device of the present invention, the semiconductor device of the present invention can meet requirements for sophistication and miniaturization of electronic devices.

EXPLANATIONS OF LETTERS OR NUMERALS

Figure 1:
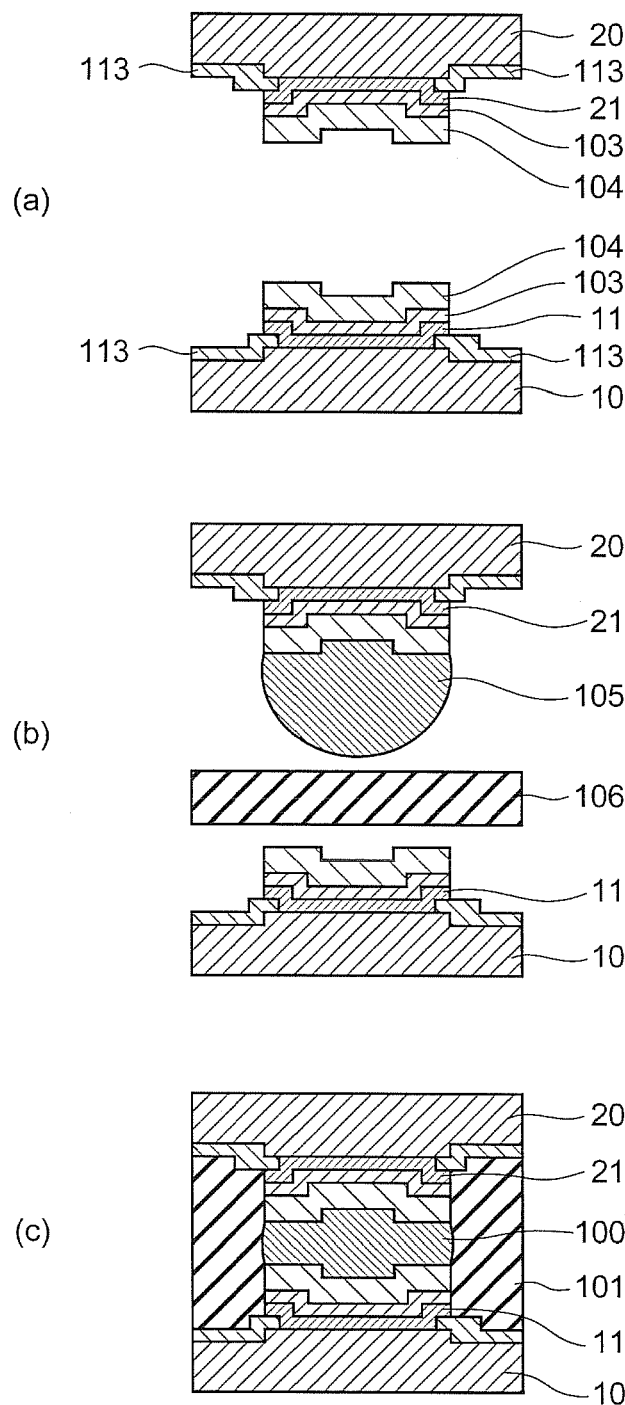
FIG. 1 shows explanatory drawings for steps in a method for using an adhesive tape according to one embodiment of the present invention.

| | |
|---|---|
| 1 | semiconductor electronic component |
| 2 | multiple-layer stack type semiconductor electronic component |
| 10 | first semiconductor chip |
| 20 | second semiconductor chip |
| 30 | third semiconductor chip |
| 11 | first internal electrode |
| 12 | external electrode |
| 20a | side surface of second semiconductor chip |
| 21 | second internal electrode |
| 30a | side surface of third semiconductor chip |
| 31 | third internal electrode |
| 100 | solder area |
| 101 | insulating area |
| 102 | through-hole |
| 103 | UBM layer |
| 104 | UBM layer |
| 105 | solder bump |
| 106 | adhesive tape |
| 107 | protecting layer |
| 108 | adhesive tape |
| 108a | solder powder |
| 109 | circuit board |
| 110 | wire |
| 111 | encapsulating resin |
| 112 | bump electrode |
| 113 | passivating layer |
| 114 | thermally-oxidized film |

BEST MODE FOR CARRYING OUT THE INVENTION

Hereinafter, the adhesive tape and the semiconductor device of the present invention will be explained.

1. Adhesive Tape

The adhesive tape of the present invention is an adhesive tape for electrically connecting semiconductor chips in a chip-on-chip type semiconductor device, comprising:
(A) 10 to 50 wt % of film forming resin;
(B) 30 to 80 wt % of curable resin; and
(C) 1 to 20 wt % of curing agent having flux activity.
The adhesive tape of the present invention is used, for example, for electrically connecting a first semiconductor chip and a second semiconductor chip in a chip-on-chip type semiconductor electronic component, wherein the circuit surface of the first semiconductor chip and the circuit surface of the second semiconductor chip are opposed to each other. Further, the adhesive tape of the present invention is used, in a multiple-layer stack type electronic component, wherein a third semiconductor chip is further provided on a surface opposite to the circuit surface of the second semiconductor chip in the aforementioned semiconductor electronic component, for electrically connecting the second semiconductor chip and the third semiconductor chip via through-holes provided in the thickness direction of the second semiconductor chip.

The adhesive tape of the present invention comprises a film forming resin, a curable resin and a curing agent having flux activity at a predetermined blending ratio. As a result, there is an advantage that electrical connection and filling between semiconductor chips can be performed together in a chip-on-chip type semiconductor device. In particular, when using a curing agent having flux activity in the adhesive tape of the present invention, an oxidized film on a solder component of a solder bump, solder powder or the like can be removed, and thereby wettability of the solder component can be improved. As a result, good electrical connection reliability between semiconductor chips can be ensured. The curing agent having flux activity functions as a curing agent at the time of curing the adhesive tape and is incorporated in resin. Therefore, flux washing is not required. Moreover, there is an advantage that flux residue, which may cause the generation of ion migration, does not remain in the free state in resin.

The adhesive tape of the present invention has the below-described two embodiments, which depend on a method for connecting semiconductor chips in which adhesion is provided using the adhesive tape of the present invention. The adhesive tape according to the first embodiment is suitably used in the case where the first semiconductor chip and the second semiconductor chip are electrically connected using a flip-chip method. The adhesive tape according to the second embodiment is suitably used in the case where the first semiconductor chip and the second semiconductor chip are electrically connected by melting solder powder contained in the adhesive tape to cause aggregation in a self-aligning manner. Hereinafter, these embodiments will be explained separately.

a. First Embodiment

Firstly, the adhesive tape according to the first embodiment of the present invention will be concretely explained.

The adhesive tape according to the first embodiment of the present invention comprises: (A) a film forming resin; (B) a curable resin; and (C) a curing agent having flux activity at a predetermined blending ratio. The adhesive tape according to the first embodiment of the present invention is particularly suitably used in the case where electrical connection between semiconductor chips in a chip-on-chip type semiconductor device in which one semiconductor chip is mounted on another semiconductor chip face down is carried out using a flip-chip method. The adhesive tape of this embodiment is interposed between semiconductor chips opposed to each other to be subjected to thermal fusion, and thereby an oxidized film on the solder component constituting the solder bump which is formed on the opposed surface side of at least one of the semiconductor chips is removed, and wettability of the solder component is improved. As a result, aggregation of the solder component between internal electrodes opposed to each other to form a solder area is promoted. In addition, the gap between the semiconductor chips is filled with a resin component, and thereby formation of an insulating area is promoted. By immobilizing the solder area and the insulating area by curing the resin component, electrical connection and filling between semiconductor chips can be performed together.

Hereinafter, constituents of the adhesive tape of this embodiment will be described.

(A) Film Forming Resin

The film-forming resin to be used in the present invention is not particularly limited as long as it can be solved in an organic solvent and independently has film-forming ability. As the film-forming resin, a thermoplastic resin or a thermosetting resin can be used solely, or they can be used in combination.

Examples of the film-forming resins include (meth)acrylic resin, phenoxy resin, polyester resin, polyurethane resin, polyimide resin, siloxane-modified polyimide resin, polybutadiene, polypropylene, styrene-butadiene-styrene copolymer, styrene-ethylene-butylene-styrene copolymer, polyacetal resin, polyvinyl butyral resin, polyvinyl acetal resin, butyl rubber, chloroprene rubber, polyamide resin, acrylonitrile-butadiene copolymer, acrylonitrile-butadiene-acrylic acid copolymer, acrylonitrile-butadiene-styrene copolymer, polyvinyl acetate, and nylon. These substances can be used solely or in combination. In particular, the film-forming resin is preferably at least one substance selected from the group consisting of (meth)acrylic resin, phenoxy resin and polyimide resin.

As used herein, the term "(meth)acrylic resin" refers to polymers of (meth)acrylic acid and derivatives thereof or a copolymer of (meth)acrylic acid or a derivative thereof and another monomer. In this regard, when describing "(meth) acrylic acid" or the like, it means acrylic acid or methacrylic acid.

Examples of (meth)acrylic resins include: polyacrylic acid; polymethacrylic acid; polyacrylic acid esters such as poly(methyl acrylate), poly(ethyl acrylate), poly(butyl acrylate), and 2-ethylhexyl-polyacrylate; polymethacrylic acid esters such as poly(methyl methacrylate), poly(ethyl methacrylate), and poly(butyl methacrylate); polyacrylonitrile; polymethacrylonitrile; polyacrylamide; butyl acrylate-ethyl acrylate-acrylonitrile copolymer; acrylonitrile-butadiene copolymer; acrylonitrile-butadiene-acrylic acid copolymer; acrylonitrile-butadiene-styrene copolymer; acrylonitrile-styrene copolymer; methyl methacrylate-styrene copolymer; methyl methacrylate-acrylonitrile copolymer; methyl methacrylate-α-methylstyrene copolymer; butyl acrylate-ethyl acrylate-acrylonitrile-2-hydroxyethyl methacrylate-methacrylic acid copolymer; butyl acrylate-ethyl acrylate-acrylonitrile-2-hydroxyethyl methacrylate-acrylic acid copolymer; butyl acrylate-acrylonitrile-2-hydroxyethyl methacrylate copolymer; butyl acrylate-acrylonitrile-acrylic acid copolymer; butyl acrylate-ethyl acrylate-acrylonitrile copolymer; and ethyl acrylate-acrylonitrile-N,N-dimethylacrylamide copolymer. Among them, butyl acrylate-ethyl acrylate-acrylonitrile copolymer and ethyl acrylate-acrylonitrile-N,N-dimethylacrylamide are preferred.

When using a (meth)acrylic resin in which a monomer having a functional group (e.g., nitrile group, epoxy group, hydroxyl group and carboxyl group) is copolymerized, the ability to adhere to a product and compatibility with other resin components can be improved. In the case of such a (meth)acrylic resin, the use amount of the monomer having the functional group is not particularly limited, but is preferably 0.1 to 50 mol %, more preferably 0.5 to 45 mol %, and even more preferably 1 to 40 mol % with respect to the total weight of the (meth)acrylic resin. When the blending amount is less than the lower limit, the effect of improving adhesion may be reduced. When the amount exceeds the upper limit, adhesion is too strong and it may cause reduction in the effect of improving workability.

The weight average molecular weight of the (meth)acrylic resin is not particularly limited, but is preferably 100,000 or more, more preferably 150,000 to 1,000,000, and even more preferably 250,000 to 900,000. When the weight average molecular weight is within the above-described range, film-forming ability can be improved.

When using a phenoxy resin as the film forming resin, the number average molecular weight thereof is preferably 5,000 to 15,000, more preferably 6,000 to 14,000, and even more preferably 8,000 to 12,000. When using the phenoxy resin, flowability of the adhesive tape before cured can be suppressed, and the interlayer thickness of the adhesive tape can be equalized. Examples of skeletons of the phenoxy resin include, but are not limited to, bisphenol A type, bisphenol F type and biphenyl skeleton type. Among them, a phenoxy resin having the saturated water absorption rate of 1% or less is preferred because it can suppress generation of foam, peel-off or the like at a high temperature at the time of adhesive joining and solder mounting. With respect to the saturated water absorption rate: the phenoxy resin is processed to form a film having the thickness of 25 μm; the film is dried under the atmosphere of 100° C. for 1 hour (absolute dry); subsequently, the film is left in a constant-temperature zone with high humidity under the atmosphere of 40° C., 90% RH; the change of weight is measured every 24 hours; and using the weight at the time of saturation of change, the saturated water absorption rate can be calculated according to the following formula:

Saturated water absorption rate (%)={(Weight at the time of saturation)−(Weight at the time of absolute dry)}/(Weight at the time of absolute dry)×100

The polyimide resin to be used in the present invention is not particularly limited as long as it has imide bond in a repeat unit. Examples thereof include those obtained by reacting diamine with acid dianhydride and heating the obtained polyamide acid to cause dehydration and ring closure. Examples of diamines include aromatic diamines (e.g., 3,3'-dimethyl-4,4'-diaminodiphenyl, 4,6-dimethyl-m-phenylenediamine, and 2,5-dimethyl-p-phenylenediamine), siloxanediamines (e.g., 1,3-bis(3-aminopropyl)-1,1,3,3-tetramethyldisiloxane), etc. These diamines can be used solely or in combination. Examples of acid dianhydrides include 3,3,4,4'-biphenyl tetracarboxylic acid, pyromellitic dianhydride, and 4,4'-oxydiphthalic dianhydride. These acid dianhydrides can be used solely or in combination. The polyimide resin may be soluble or insoluble in solvents. When the polyimide resin is soluble in solvents, varnish can be easily obtained at the time of mixing with other components and it is excellent in handleability. Siloxane-modified polyimide resin is particularly preferably used because it can be solved in various organic solvents.

As the film forming resin, a commercially-available product can be used. Further, additives such as plasticizers, stabilizers, inorganic fillers, antistatic agents and pigments may be blended therewith in a range in which the effects of the present invention are not reduced.

In the adhesive tape according to the first embodiment of the present invention, the blending amount of the film forming resin is 10 to 50 wt %, preferably 15 to 40 wt %, and more preferably 20 to 35 wt % with respect to the total amount of the constituents of the adhesive tape. Within this range, flowability of the resin component in the adhesive tape before melted can be suppressed, and therefore handleability of the adhesive tape can be improved.

(B) Curable Resin

In general, the curable resin to be used in the present invention is not particularly limited as long as it can be used as an adhesive component for semiconductors. Examples of the curable resins include epoxy resin, oxetane resin, phenol resin, (meth)acrylate resin, unsaturated polyester resin, diallyl phthalate resin, and maleimide resin. Among them, epoxy resin is preferably used because it is excellent in curability and preservation property, and heat resistance, moisture resistance and chemical resistance of a cured product are excellent.

The epoxy resin to be used may be solid or liquid at room temperature. An epoxy resin which is solid at room temperature and an epoxy resin which is liquid at room temperature can be used in combination, and thereby melting behavior of resin can be more freely designed.

Examples of the epoxy resins which are solid at room temperature include bisphenol A type epoxy resins, bisphenol S type epoxy resins, phenol novolac type epoxy resins, cresol novolac type epoxy resins, glycidyl amine type epoxy resins, glycidyl ester type epoxy resins, trifunctional epoxy resins and tetrafunctional epoxy resins, but are not particularly limited thereto. More specifically, solid trifunctional epoxy resins, cresol novolac type epoxy resins, etc. are preferably used. These epoxy resins can be used solely or in combination.

The softening point of the epoxy resin which is solid at room temperature is preferably 40 to 120° C., more preferably 50 to 110° C., and even more preferably 60 to 100° C. Within this range, tackiness of the adhesive tape can be suppressed, and therefore handleability of the adhesive tape can be improved.

Examples of the epoxy resins which are liquid at room temperature include bisphenol A type epoxy resins and bisphenol F type epoxy resins, but are not particularly limited thereto. Further, a bisphenol A type epoxy resin and a bisphenol F type epoxy resin may be used in combination.

The epoxy equivalent of the epoxy resin which is liquid at room temperature is preferably 150 to 300, more preferably 160 to 250, and even more preferably 170 to 220. When the epoxy equivalent is lower than the lower limit of the range, the shrinkage ratio of a cured product tends to be increased. In this case, there is a possibility of generation of a warpage of the semiconductor chip adhered using the adhesive tape of the present invention. When the epoxy equivalent is higher than the upper limit of the range, the reactivity with the film forming resin (in particular, the polyimide resin) may be decreased.

As the curable resin such as epoxy resin, a commercially available product can be used. Further, additives such as plasticizers, stabilizers, inorganic fillers, antistatic agents and pigments may be blended therewith in a range in which the effects of the present invention are not reduced.

In the adhesive tape according to this embodiment, the blending amount of the curable resin is 30 to 80 wt %, preferably 35 to 75 wt %, and even more preferably 40 to 70 wt % with respect to the total amount of the constituents of the adhesive tape. Within this range, electrical connection strength and mechanical adhesive strength between semiconductor chips can be ensured.

(C) Curing Agent Having Flux Activity

As used herein, the term "curing agent having flux activity" means a compound, which has reduction action sufficient to reduce an oxidized film on the surface of a solder bump provided on a semiconductor chip to electrically connect a solder bump and a conductive member, and which has a functional group which binds to resin. At the time of melting the adhesive tape, the curing agent having flux activity reduces an oxidized film on the surface of the solder bump, improves wettability of the solder component constituting the solder bump, promotes aggregation of the solder component between internal electrodes opposed to each other which are provided on the semiconductor chips, and thereby facilitates formation of a solder area. After electrical connection between the semiconductor chips is formed, the curing agent having flux activity functions as a curing agent, and may be added to resin to increase the coefficient of elasticity or Tg of the resin. In the adhesive tape of the present invention, since the above-described curing agent having flux activity is used, there is an advantage that generation of ion migration caused by flux residue can be suppressed without the necessity of flux washing.

The curing agent having flux activity to be used in the present invention preferably has at least one carboxyl group. The functional group which binds to resin contained in the curing agent having flux activity to be used in the present invention can be suitably selected depending on the type and the like of (B) the curable resin to be used. For example, when an epoxy resin is contained as (B) the curable resin, the curing agent having flux activity preferably has a carboxyl group and a group which reacts with an epoxy group. Examples of groups which react with an epoxy group include a carboxyl group, a hydroxyl group and an amino group.

Specifically, the curing agent having flux activity to be used in the present invention is preferably at least one substance selected from the group consisting of aliphatic dicarboxylic acid and compounds having a carboxyl group and a phenolic hydroxyl group.

The aliphatic dicarboxylic acid to be used in the present invention is not particularly limited as long as it is a compound in which two carboxyl groups bind to aliphatic hydrocarbon. The aliphatic hydrocarbon group may be saturated or unsaturated acyclic, or may be saturated or unsaturated cyclic. When the aliphatic hydrocarbon group is acyclic, it may be linear or branched.

Examples of the aliphatic dicarboxylic acids include a compound represented by the following formula (1):

$$\text{HOOC—(CH}_2)_n\text{—COOH} \quad (1)$$

In the formula, n is an integer from 1 to 20, and preferably an integer from 3 to 10. Within this range, flux activity, outgas at the time of adhesion, and the balance between the coefficient of elasticity and glass transition temperature after the adhesive tape is cured are favorable. In particular, when n is 3 or higher, increase of the coefficient of elasticity after the adhesive tape is cured can be suppressed, and the ability to adhere to a product can be improved. Further, when n is 10 or lower, decrease of coefficient of elasticity can be suppressed, and connection reliability can be further improved.

Specific examples of the compounds represented by the above-described formula (1) include glutaric acid, adipic acid, pimelic acid, suberic acid, azelaic acid, sebacic acid, undecanedioic acid, dodecanedioic acid, tridecanedioic acid, tetradecanedioic acid, pentadecanedioic acid, octadecanedioic acid, nonadecanedioic acid, and eicosanedioic acid. Among the above-described substances, adipic acid, suberic acid, sebacic acid, and dodecanedioic acid are preferred, and sebacic acid is particularly preferred.

Examples of compounds having a carboxyl group and a phenolic hydroxyl group include: benzoic acid derivatives such as salicylic acid, 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, and gallic acid (3,4,5-trihydroxybenzoic acid); naphthoic acid derivatives such as 1,4-dihydroxy-2-naphthoic acid and 3,5-dihydroxy-2-naphthoic acid; phenolphthalin; and diphenolic acid. Among the above-described substances, phenolphthalin, gentisic acid, 2,4-dihydroxybenzoic acid and 2,6-dihydroxybenzoic acid are preferred, and phenolphthalin, gentisic acid or a combination thereof is particularly preferred.

Any of these compounds has high moisture absorption and causes voids. Therefore, such a compound is preferably dried before use.

In the present invention, the curing agents having flux activity may be used solely or in combination. In the adhesive tape according to this embodiment, the blending amount of the curing agent having flux activity is 1 to 20 wt %, preferably 3 to 18 wt %, and more preferably 5 to 15 wt % with respect to the total amount of the constituents of the adhesive tape. Within this range, the oxidized film on the surface of the solder bump can be sufficiently reduced to the extent that it can be electrically connected. Further, at the time of curing the resin component, the curing agent having flux activity can be efficiently added to the resin to increase the coefficient of elasticity or Tg of the resin. Moreover, generation of ion migration caused by an unreacted curing agent having flux activity can be suppressed.

(D) Other Components

The adhesive tape according to this embodiment may comprise components other than those described above within a range in which the effects of the present invention are not reduced.

For example, the adhesive tape according to the embodiment may further comprise a curing agent other than the above-described component (C). Examples thereof include phenols, amines and thiols. These substances may be suitably selected depending on the type, etc. of (B) the curable resin used. For example, when using epoxy resin as the curable resin, phenols are suitably used from the viewpoint of good reactivity with epoxy resin, small change in size at the time of curing, and suitable physical properties after curing (e.g., heat resistance and moisture resistance).

The phenols to be used in the present invention are not particularly limited, but are preferably bifunctional or higher because of excellent physical properties of the adhesive tape after curing. Examples thereof include bisphenol A, tetramethyl bisphenol A, diallyl bisphenol A, biphenol, bisphenol F, diallyl bisphenol F, trisphenol, tetrakisphenol, phenol novolacs, and cresol novolacs. Among them, phenol novolacs and cresol novolacs are preferably used because they have good melt viscosity and reactivity with epoxy resin and have excellent physical properties after curing.

The blending amount of the curing agent may be suitably selected depending on the types of the curable resin and curing agent used or the type and use amount of the curing agent having flux activity. For example, when using a phenol novolac as the curing agent, the blending amount thereof is preferably 5 wt % or more, and more preferably 10 wt % or more with respect to the total amount of the constituents of the adhesive tape on the point that the curable resin can be surely cured. When phenol novolacs which are unreacted with epoxy resin remain, they cause ion migration. In order to prevent residues thereof, the amount is preferably 30 wt % or less, and more preferably 25 wt % or less.

The blending amount of phenol novolac resin may be defined with the equivalent ratio with respect to epoxy resin. For example, the equivalent ratio of phenol novolac resin to epoxy resin is 0.5 to 1.2, preferably 0.6 to 1.1, and more preferably 0.7 to 0.98. When the equivalent ratio of phenol novolac resin to epoxy resin is 0.5 or more, heat resistance and moisture resistance after curing can be ensured. When the equivalent ratio is 1.2 or less, the amount of the remaining phenol novolac resin unreacted with epoxy resin after curing can be decreased, leading to good ion migration resistance.

These curing agents can be used solely or in combination.

The adhesive tape according to the embodiment may further include a curing accelerator. The curing accelerator can be suitably selected depending on the type, etc. of the curable resin. For example, imidazole compounds having a melting point of 150° C. or higher can be used. When the melting point of the curing accelerator used is 150° C. or higher, the solder component constituting the solder bump can move to the surfaces of the internal electrodes provided on the semiconductor chips before curing of the adhesive tape is completed, leading to good electrical connection between the internal electrodes. Examples of imidazole compounds having a melting point of 150° C. or higher include 2-phenylhydroxyimidazole and 2-phenyl-4-methylhydroxyimidazole.

The blending amount of the curing accelerator can be suitably selected. For example, when using an imidazole compound as the curing accelerator, the amount thereof is preferably 0.005 to 10 wt %, and more preferably 0.01 to 5 wt % with respect to the total amount of the constituents of the adhesive tape. When the blending amount of the imidazole compound is 0.005 wt % or more, the function as the curing accelerator can be more effectively exerted, and thereby the curability of the adhesive tape can be improved. When the blending amount of imidazole is 10 wt % or less, the melt viscosity of resin at the melting temperature of the solder component constituting the solder bump is not too high, and therefore good solder junction structure can be obtained. Moreover, preservation property of the adhesive tape can be further improved.

These curing accelerators can be used solely or in combination.

The adhesive tape according to the embodiment can further include a silane coupling agent. When including the silane coupling agent, adhesiveness of the adhesive tape to the semiconductor chip can be improved. Examples of the silane coupling agents include an epoxysilane coupling agent and an aromatic ring-containing aminosilane coupling agent. These substances can be used solely or in combination. The blending amount of the silane coupling agent can be suitably selected, but is preferably 0.01 to 10 wt %, more preferably 0.05 to 5 wt %, and even more preferably 0.1 to 2 wt % with respect to the total amount of the constituents of the adhesive tape.

In addition to the above-described components, various additives may be suitably blended in the adhesive tape according to the embodiment for the purpose of improving various properties such as compatibility and stability of resin and workability.

Next, the method for producing the adhesive tape of the first embodiment will be described.

(A) the film forming resin, (B) the curable resin, (C) the curing agent having flux activity, and other components (if required) are mixed in a solvent, and varnish thus obtained is applied on a substrate subjected to release treatment such as a polyester sheet. This is dried at a predetermined temperature to the extent that no solvent is substantially included, and thereby the adhesive tape of the first embodiment is obtained. The solvent to be used is not particularly limited as long as it is inactive with respect to the components to be used. Examples of preferred solvents include: ketones such as acetone, methyl ethyl ketone, methyl isobutyl ketone, DIBK (diisobutyl ketone), cyclohexanone and DAA (diacetone alcohol); aromatic hydrocarbons such as benzene, xylene and toluene; alcohols such as methyl alcohol, ethyl alcohol, isopropyl alcohol and n-butyl alcohol; cellosolve-based substances such as methyl cellosolve, ethyl cellosolve, butyl cellosolve, methyl cellosolve acetate and ethyl cellosolve acetate; NMP (N-methyl-2-pyrrolidone); THF (tetrahydrofuran); DMF (dimethylformamide); DBE (dibasic ester); EEP (ethyl 3-ethoxypropionate); and DMC (dimethyl carbonate). The use amount of the solvent is preferably within the range in which the solid content in the components mixed in the solvent is 10 to 60 wt %.

In this embodiment, the thickness of the adhesive tape is not particularly limited, but is preferably 5 to 300 μm, more preferably 10 to 200 μm, and even more preferably 15 to 150 μm. Within this range, the gap between the semiconductor chips can be sufficiently filled with the resin component. Therefore, after the resin component is cured, the mechanical adhesive strength can be ensured.

In addition, in this embodiment, the adhesive tape preferably has a desired solder wet-spreading ratio (%). That is, when a tin-containing solder ball having the diameter of 500 μm is provided on the adhesive tape of this embodiment and it is heated for 20 seconds at a temperature which is 30° C. higher than the melting point of the solder ball, the solder wet-spreading ratio of the adhesive tape represented by the following formula (I) is preferably 40% or higher:

$$\text{Solder wet-spreading ratio (\%)} = [\{(\text{diameter of solder ball}) - (\text{thickness of solder after wet spreading})\} / (\text{diameter of solder ball})] \times 100 \quad (I)$$

In the case where a circuit substrate is subjected to metal joining using a solder bump, the higher the solder wet-spreading ratio, the stronger the intermetallic bond, and therefore joint strength is increased. When the solder wet-spreading ratio is 40% or higher, it is sufficient to prevent generation of defective joint. However, in consideration of increase in probability of joining and joining reliability under various circumstances after joining, the solder wet-spreading ratio is more preferably 45% or higher, and even more preferably 50% or higher.

When the solder wet-spreading ratio is 60% or higher, the aforementioned (C) curing agent having flux activity preferably contains aliphatic dicarboxylic acid. That is because, when the solder wet-spreading ratio is 60% or higher and therefore strong reducing power is required, it is desirable that electrical connection reliability is ensured by improving wettability of the solder component using aliphatic dicarboxylic acid, which has higher flux activity.

Meanwhile, when the solder wet-spreading ratio is 40 to 60%, (C) the curing agent having flux activity preferably contains a compound having a carboxyl group and a phenolic hydroxyl group. That is because, when the solder wet-spreading ratio is within the above-described range and reducing power required is not so strong, it is desirable that generation of ion migration caused by flux residue can be more effectively suppressed using a compound which is highly reactive with the curable resin (e.g., epoxy resin).

Regarding conditions for measuring the solder wet-spreading ratio, in order to reduce variation of the degree of wet-spreading of the solder ball, heating is performed at a temperature which is 30° C. higher than the melting point of the solder ball. Further, in consideration of time required for melting of the curing agent having flux activity, migration thereof to the surface of the solder ball and wet-spreading of solder and variation of the degree of wet-spreading of solder, heating time is set as 20 seconds.

The solder wet-spreading ratio is specifically obtained using the following measurement method.
(1) To a bare Cu plate (manufactured by Hirai Seimitsu Kogyo Co., Ltd.), an adhesive tape having the thickness of 15 μm is attached.
(2) On the adhesive tape, the following solder balls having the diameter of 500 μm are stationarily placed.
(i) "M31" (Sn/Ag/Cu, melting point: 217° C., manufactured by Senju Metal Industry Co., Ltd.)
(ii) "L20" (Sn/Bi, melting point: 138° C., manufactured by Senju Metal Industry Co., Ltd.)
(3) Based on ASTM B 545, a hot plate is heated to a temperature which is 30° C. higher than the melting point of each of the solders, and the above-described sample is heated on the hot plate for 20 seconds.
(4) The height of the solder balls wet-spread on the bare Cu plate is measured.
(5) The solder wet-spreading ratio is calculated using the following formula (I):

Solder wet-spreading ratio (%)=[{(diameter of solder ball)−(thickness of solder after wet spreading)}/(diameter of solder ball)]×100   (I)

In this embodiment, when the thickness is 100 μm, the melt viscosity of the adhesive tape at 223° C. is preferably 10 to 200000 Pa·s, and more preferably 10 to 10000 Pa·s. When the melt viscosity is 10 Pa·s or higher, reduction in connection reliability and contamination of surrounding members caused by bleeding of the adhesive tape from the semiconductor chip (adherend) when heating can be suppressed. In addition, defects such as generation of air bubbles and insufficient filling of the resin component in the gap between the semiconductor chips can be prevented. Moreover, it is possible to prevent the problem of shorting out between adjacent electrodes caused by too much wet-spreading of solder. When the melt viscosity is 200000 Pa·s or less, at the time of metal joining of the solder bump and the internal electrode provided on the semiconductor chip, resin between the solder bump and the internal electrode is removed, and therefore generation of defective joint can be suppressed. The melt viscosity is even more preferably 50 to 5000 Pa·s, and particularly preferably 300 to 1500 Pa·s.

The melt viscosity of the adhesive tape is obtained using the following measurement method. That is, the adhesive tape having the thickness of 100 μm is subjected to measurement using a viscoelasticity measuring apparatus (JASCO International Co., Ltd.) (rate of temperature increase: 30° C./min, frequency: 1.0 Hz, measuring stress by constant distortion), and the viscosity at the atmospheric temperature of 223° C., which is the melting point of Sn/Ag (=96.5/3.5), is regarded as a measurement value.

By using the adhesive tape according to the first embodiment of the present invention as described below, the semiconductor chips can be electrically connected. Hereinafter, explanation will be made with reference to the drawings. FIG. 1 shows explanatory drawings for steps in a method for using the adhesive tape according to the first embodiment of the present invention.

As shown in FIG. 1(a), firstly, a semiconductor chip 10 in which an internal electrode 11 is provided on a circuit surface thereof and a semiconductor chip 20 in which an internal electrode 21 is provided on a circuit surface thereof are prepared. In order to obtain good electrical connection, surfaces of the internal electrodes 11 and 21 may be subjected to treatment such as washing, polishing, plating and surface activation in advance. For example, as shown in FIG. 1(a), UBM (Under Barrier Metal) layers 103 and 104 may be formed on the surfaces of the internal electrodes 11 and 21 using Ti, Ti/Cu, Cu, Ni, Cr/Ni or the like. One or more UBM layers may be formed. The surfaces of the semiconductor chips 10 and 20 may be subjected to surface stabilization treatment in advance for the purpose of protecting a semiconductor element. For example, a passivating layer 113 (e.g., SiN film) may be formed. Further, as a layer for releasing residual stress present in the joint portion between a solder bump and the UBM layer and the internal electrode, an organic resin protecting layer such as a polyimide film, a polybenzooxazol film and a benzocyclobutene film may be formed (not shown).

Next, as shown in FIG. 1(b), a solder bump 105 is formed on at least one of the internal electrodes 11 and 21. The solder bump 105 may be formed by means of a plating method, a solder paste printing method or a method in which a solder ball is mounted. In FIG. 1(a), the solder bump 105 is formed on the internal electrode 21, but it may be formed only on the internal electrode 11, and it may be formed on both the internal electrodes 11 and 21. The solder bump 105 may be subjected to reflow process after it is formed.

A solder component constituting the solder bump 105 is preferably an alloy comprising at least two substances selected from the group consisting of tin (Sn), silver (Ag), bismuth (Bi), indium (In), zinc (Zn) and copper (Cu). Among these substances, alloys containing Sn such as Sn—Bi alloy, Sn—Ag—Cu alloy and Sn—In alloy are preferred in view of melting temperature and mechanical properties. The melting point of the solder bump is generally 100° C. or higher, and preferably 130° C. or higher from the viewpoint of ensuring sufficient flowability of a resin component in an adhesive tape. Further, the melting temperature of the solder bump is generally 250° C. or lower, and preferably 230° C. or lower from the viewpoint of preventing heat deterioration of an element provided on a circuit board or a semiconductor chip at the time of adhesion. An endothermic peak temperature, which is obtained when measuring solder powder alone constituting the solder bump with the rate of temperature increase of 10° C./min using DSC or the like, is regarded as the melting point of the solder bump.

Regarding the size of the solder bump 105, the diameter thereof is preferably 5 to 500 μm, more preferably 10 to 300 μm, and even more preferably 20 to 200 μm from the viewpoint of ensuring sufficient electrical connection reliability.

Next, as shown in FIG. 1(c), an adhesive tape 106 is interposed between the semiconductor chip 10 and the semiconductor chip 20, and it is heated to a temperature at which curing of the adhesive tape 106 is not completed and the solder bump 105 is melted. By heating, the solder component constituting the solder bump 105 is melted, and the melted solder component is aggregated on the surface of the internal electrode. Further, the surface of the internal electrode and the solder component are joined together to form a solder area 100, and thereby internal electrodes opposed to each other are electrically connected.

At the time point when the heating temperature reaches the melting point of the solder bump, the distance between the internal electrodes opposed to each other may be decreased by applying pressure on the semiconductor chips 10 and 20.

Thus, the solder component melted by heating is aggregated between the internal electrodes opposed to each other and is fixed to form the solder area 100 as shown in FIG. 1(c), and thereby the internal electrodes opposed to each other are electrically connected. Meanwhile, the gap between the semiconductor chip 10 and the semiconductor chip 20 is filled with a resin component contained in the adhesive tape 106, and thus the resin component fauns an insulating area 101. The internal electrodes adjacent to each other are electrically insulated by the insulating area 101.

Next, the resin component of the adhesive tape 106 is completely cured to ensure electrical isolation and mechanical adhesive strength. According to this embodiment, the internal electrodes opposed to each other are electrically connected in this way, and the gap between the semiconductor chip 10 and the semiconductor chip 20 can be sealed with the insulating resin.

Electrical connection and filling between semiconductor chips via through-holes provided in the thickness direction of the semiconductor chips can be carried out in a manner similar to that described above using the adhesive tape according to this embodiment. Thus, electrical connection and filling between semiconductor chips can be performed together using the adhesive tape of this embodiment.

b. Second Embodiment

Next, the adhesive tape according to the second embodiment of the present invention will be described.

The adhesive tape according to the second embodiment of the present invention further comprises (E) solder powder in addition to (A) a film forming resin, (B) a curable resin and (C) a curing agent having flux activity at a predetermined ratio. The adhesive tape according to the second embodiment of the present invention is particularly suitably used in the case where electrical connection between semiconductor chips in a chip-on-chip type semiconductor device in which one semiconductor chip is mounted on another semiconductor chip face down is performed utilizing self-alignment of the solder powder contained in the adhesive tape. The adhesive tape of this embodiment is interposed between the semiconductor chips opposed to each other and subjected to thermal fusion, and thereby the solder powder contained in the adhesive tape is aggregated between the internal electrodes opposed to each other to promote formation of a solder area. In addition, the gap between the semiconductor chips is filled with the resin component to promote formation of an insulating area. By immobilizing the solder area and the insulating area by curing the resin component, electrical connection and filling between semiconductor chips can be performed together. In the case of the adhesive tape of this embodiment, it is not necessary to form a solder bump on a semiconductor chip. Therefore, it is useful on the point that electrical connection between semiconductor chips can be performed using a simpler and easier method.

The constituents of the adhesive tape of the second embodiment are identical to those of the adhesive tape of the first embodiment except for the solder powder, and the adhesive tape comprises (A) a film forming resin, (B) a curable resin, (C) a curing agent having flux activity, and if required, (D) other components. Since specific examples of each of the components and blending amount thereof are as in the case of the first embodiment above, no explanation is repeated. In the second embodiment, the blending amount of each of the components is determined relative to the total amount of the constituents of the adhesive tape from which the solder powder is excluded.

In this embodiment, examples of solder components constituting (E) the solder powder include lead-free solder. The lead-free solder is not particularly limited, but is preferably an alloy of at least two substances selected from the group consisting of Sn, Ag, Bi, In, Zn and Cu. Among these substances, alloys containing Sn such as Sn—Bi alloy, Sn—Ag—Cu alloy, Sn—In alloy and Sn—Ag alloy are preferred in view of melting temperature and mechanical properties.

The average particle diameter of the solder powder is suitably selected depending on the surface area of the semiconductor chip and the desired distance between the semiconductor chips, but is preferably about 1 to 100 μm, more preferably 5 to 100 μm, and even more preferably 10 to 50 μm. Within this range, the solder component can be surely aggregated on the surfaces of the internal electrodes. Moreover, bridging between adjacent internal electrodes can be suppressed, and shorting out between adjacent internal electrodes can be prevented. The average particle diameter of the solder powder can be measured, for example, using the laser diffraction and scattering method.

From the viewpoint of ensuring sufficient flowability of resin component at the time of melting the adhesive tape, the melting point of the solder powder is generally 100° C. or higher, and more preferably 130° C. or higher. In order to prevent heat deterioration of an element provided on a circuit board or a semiconductor chip at the time of adhesion, the melting point of the solder powder is generally 250° C. or lower, and preferably 230° C. or lower.

The blending amount of the solder powder is preferably 30 to 200 parts by weight, more preferably 40 to 180 parts by weight, and even more preferably 50 to 160 parts by weight per 100 parts by weight (total amount) of the constituents of the adhesive tape other than the solder powder.

The adhesive tape of this embodiment can be produced in a manner similar to that in the case of the first embodiment. That is, the components (A) to (C), other components (D) (if required), and the solder powder (E) are mixed in a solvent; varnish thus obtained is applied on a substrate subjected to release treatment such as a polyester sheet; this is dried at a predetermined temperature to the extent that no solvent is substantially included; and thereby the adhesive tape can be obtained. The solvents to be used in the first embodiment described above can also be used in the second embodiment.

The thickness of the adhesive tape of the second embodiment is not particularly limited, but is preferably 5 to 300 μm, more preferably 10 to 200 μm, and even more preferably 15 to 150 μm. Within this range, the gap between the semiconductor chips can be sufficiently filled with the resin component. Therefore, after the resin component is cured, the mechanical adhesive strength can be ensured.

In this embodiment, when the thickness is 100 μm, the melt viscosity of the adhesive tape at 138° C. is preferably 1 to 10000 Pa·s, and more preferably 10 to 10000 Pa·s. Within this range, diffusion of the solder component from the internal electrodes can be suppressed, and at the same time, bleeding of the resin component can be suppressed. Regarding the melt viscosity of the adhesive tape, the adhesive tape having the thickness of 100 μm is subjected to measurement using a viscoelasticity measuring apparatus (JASCO International Co., Ltd.) (rate of temperature increase: 10° C./min, frequency: 0.1 Hz, measuring stress by constant distortion), and the viscosity at the atmospheric temperature of 138° C., which is the melting point of Sn/Bi (=42/58), is regarded as a measurement value.

When the melt viscosity is 1 Pa·s or more, the solder powder does not stick out from the semiconductor chip (adherend), and insulation failure can be suppressed. Moreover, reduction in connection reliability and contamination of surrounding members caused by bleeding of the adhesive tape from the semiconductor chip (adherend) when heating can be suppressed. In addition, defects such as generation of air bubbles and insufficient filling of the resin component in the gap between the semiconductor chips can be prevented. When the melt viscosity is 10000 Pa·s or less, the probability of contact between the solder powder and the curing agent having flux activity is increased, and reduction of the oxidized film is efficiently performed. Moreover, since the solder powder easily moves, the probability that the solder powder remains in the space between the electrodes of the semiconductor chips (adherends) is decreased, and generation of insulation failure can be suppressed. Furthermore, at the time of metal joining of the solder bump and the internal electrode provided on the semiconductor chip, resin between the solder bump and the internal electrode is removed, and therefore generation of defective joint can be suppressed. The melt viscosity is even more preferably 50 to 5000 Pa·s, particularly preferably 100 to 4000 Pa·s, and most preferably 100 to 2000 Pa·s.

Figure 2:
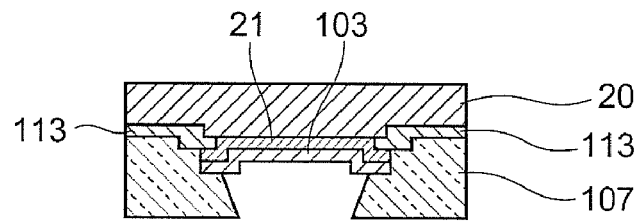
FIG. 2 shows explanatory drawings for steps in a method for using an adhesive tape according to one embodiment of the present invention.
Figure 2:
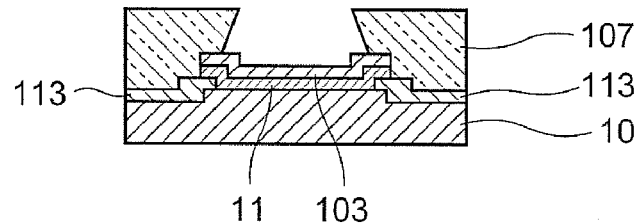
Figure 2:
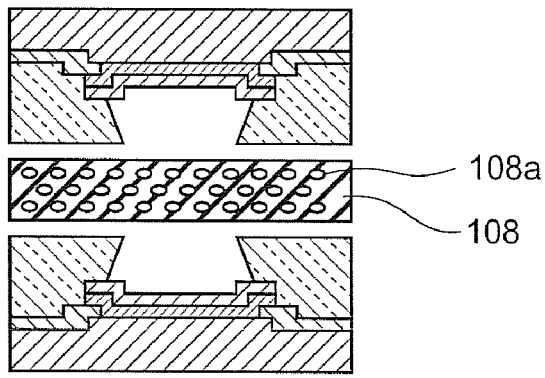
Figure 2:
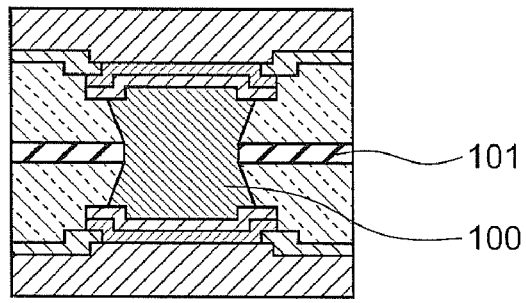

The semiconductor chips can be electrically connected to each other using the adhesive tape of the second embodiment of the present invention as follows. FIG. 2 shows explanatory drawings for steps in a method for using the adhesive tape according to the second embodiment of the present invention.

Firstly, as shown in FIG. 2(a), a semiconductor chip 10 on which an internal electrode 11 is provided and a semiconductor chip 20 on which an internal electrode 21 is provided are positioned so that the surfaces thereof on which the internal electrode is provided (circuit surfaces) are opposed to each other.

On the surface of the semiconductor chip 10 and the surface of the semiconductor chip 20, a protecting layer 107 may be formed in a way in which positions at the internal electrodes 11 and 21 are opened. For example, a protecting layer made of organic resin such as a polyimide film, a polybenzooxazol film and a benzocyclobutene film may by formed. This allows the solder component to be more easily introduced into the space between the internal electrodes opposed to each other, and good electrical connection between the internal electrodes can be provided. Further, the film can function as a stress relaxation layer. The form of the protecting layer 107 is not limited to the form shown in the drawing as long as it has the above-described functions. Further, the surfaces of the internal electrodes 11 and 21 may be subjected to treatment such as washing, polishing, plating and surface activation in advance. For example, as shown in FIG. 2(a), a UBM (Under Bump Metal) layer 103 may be formed on the surfaces of the internal electrodes 11 and 21 using Ti, Ti/Cu, Cu, Ni, Cr/Ni or the like. One or more UBM layers may be formed. The surfaces of the semiconductor chips 10 and 20 may be subjected to surface stabilization treatment in advance for the purpose of protecting a semiconductor element. For example, a passivating layer 113 (e.g., SiN film) may be formed.

Next, as shown in FIG. 2(b), an adhesive tape 108 is interposed between the semiconductor chip 10 and the semiconductor chip 20. The adhesive tape 108 includes solder powder 108a. The adhesive tape 108 is heated to a temperature at which curing of the tape is not completed and the solder powder 108a in the tape is melted. By heating, as shown in FIG. 2(c), the solder powder 108a is melted, moves through the resin component and aggregates on the surfaces of the internal electrodes in a self-aligning manner to form a solder area 100, and thereby the surfaces of the internal electrodes and the melted solder powder are joined together and internal electrodes opposed to each other are electrically connected. Meanwhile, the gap between the semiconductor chips is filled with the resin component of the adhesive tape to form an insulating area 101, by which internal electrodes adjacent to each other are electrically insulated.

At the time point when the heating temperature reaches the melting point of the solder powder, the distance between the internal electrodes opposed to each other may be decreased by applying pressure on the semiconductor chips 10 and 20.

Next, the resin component of the adhesive tape 108 is completely cured to ensure electrical connection strength and mechanical adhesive strength. The internal electrodes 11 and 21 which are opposed to each other are electrically connected in this way, and the gap between the semiconductor chip 10 and the semiconductor chip 20 can be sealed with the insulating resin.

Electrical connection and filling between semiconductor chips via through-holes provided in the thickness direction of the semiconductor chips using the adhesive tape of this embodiment can be performed in a manner similar to that described above. Thus, electrical connection and filling between semiconductor chips can be performed together using the adhesive tape of this embodiment.

2. Semiconductor Device

Next, the semiconductor device of the present invention will be described.

The semiconductor device of the present invention is a chip-on-chip type semiconductor device in which semiconductor chips are electrically connected using the adhesive tape of the present invention. Examples of embodiments of the present invention include a semiconductor device comprising a chip-on-chip type semiconductor electronic component in which the circuit surface of a first semiconductor chip and the circuit surface of a second semiconductor chip are opposed to each other, wherein the first semiconductor chip and the second semiconductor chip are adhered to each other using the adhesive tape of the present invention. Examples of other embodiments of the present invention include a semiconductor device comprising a multiple-layer stack type semiconductor electronic component in which a third semiconductor chip is further provided on the surface opposite to the circuit surface of the second semiconductor chip, wherein the second semiconductor chip and the third semiconductor chip are electrically connected via through-holes provided in the thickness direction of the second semiconductor chip using the adhesive tape of the present invention. In the aforementioned multiple-layer stack type semiconductor electronic component, the adhesive tape of the present invention may be used only for adhesion between the second semiconductor chip and the third semiconductor chip. The semiconductor device of the present invention is not particularly limited as long as semiconductor chips therein are adhered to each other using the adhesive tape of the present invention.

As described above, according to the preferred embodiment of the present invention, by adjusting the melt viscosity of the adhesive tape of the present invention, bleeding of the resin component, etc. which occurs at the time of melting the adhesive tape can be minimized. Therefore, it is possible to reduce the distance between semiconductor chips or the distance between the side surface of the upper semiconductor chip and an external electrode provided on the circuit surface of the lower semiconductor chip. Accordingly, the integration density of semiconductor chips, which one package can include, can be increased. Moreover, size and thickness reduction in a whole package can be realized. Furthermore, the distance between internal electrodes can be reduced, and the amount of information to be included in one package can be increased. Hereinafter, the semiconductor device of the present invention will be specifically described with reference to the drawings.

Figure 3:
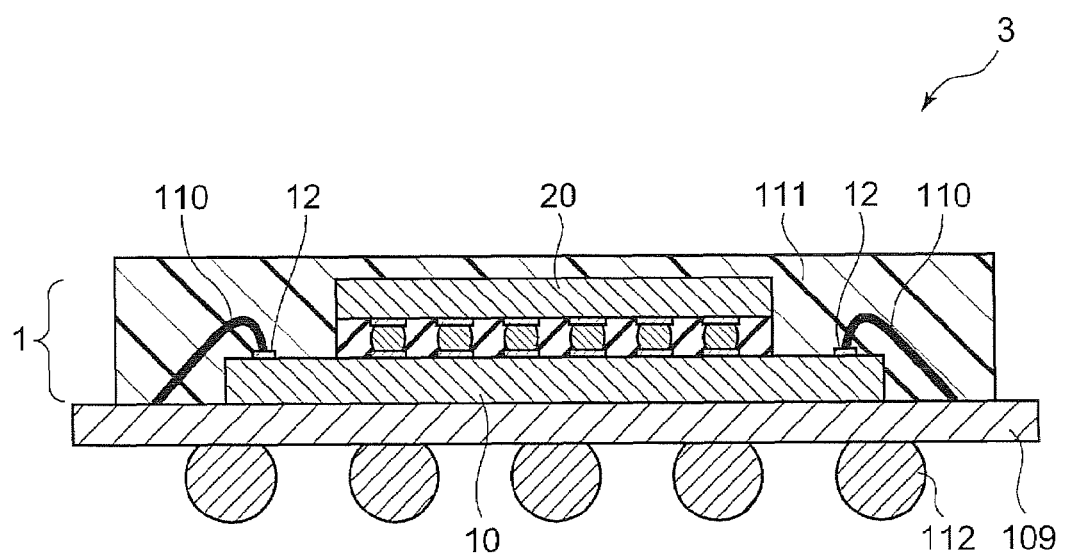
FIG. 3 shows a schematic cross sectional view of a semiconductor device according to one embodiment of the present invention.

FIG. 3 shows a schematic cross sectional view of a semiconductor device according to one embodiment of the present invention. As shown in FIG. 3, an external electrode 12 provided on a semiconductor chip 10 and an electrode (not shown) provided on a circuit board 109 are electrically connected via a wire 110, and a semiconductor electronic component 1 is mounted on the circuit board 109. The semiconductor electronic component 1, circuit board 109 and wire 110 are sealed with an encapsulating resin 111. Further, a plurality of bump electrodes 112 are provided on the rear surface of the circuit board 109.

Figure 4:
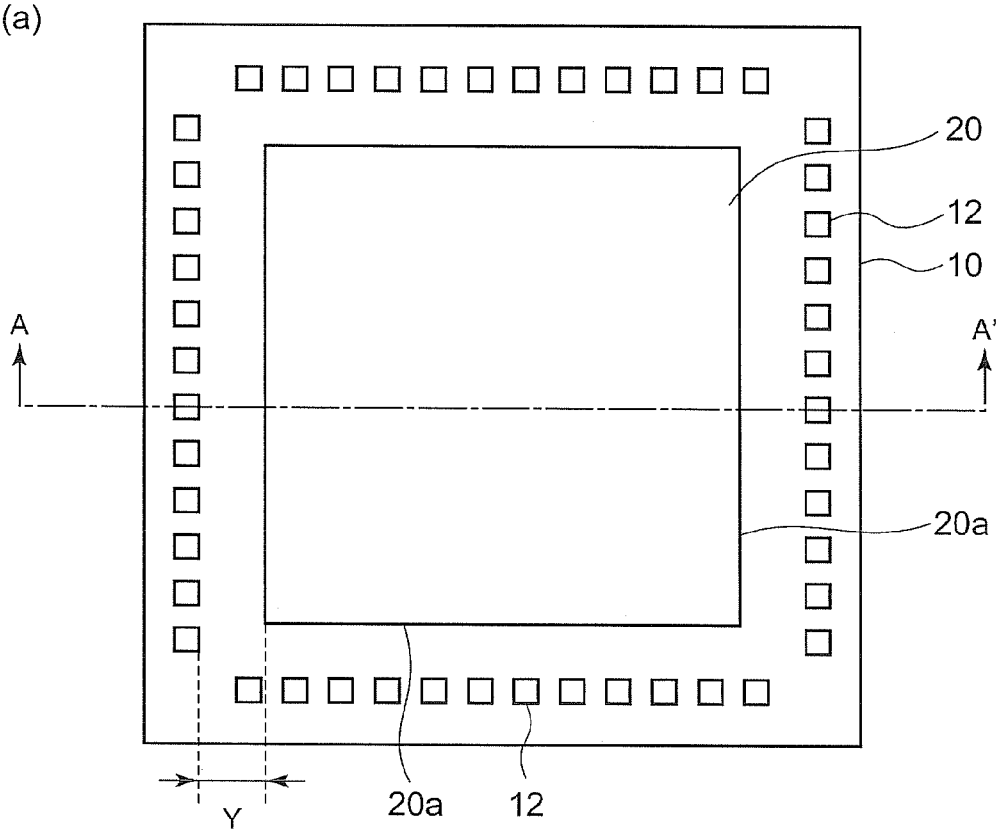
FIG. 4 shows a schematic top view and a schematic cross sectional view of a semiconductor electronic component to be used in a semiconductor device according to one embodiment of the present invention.
Figure 4:
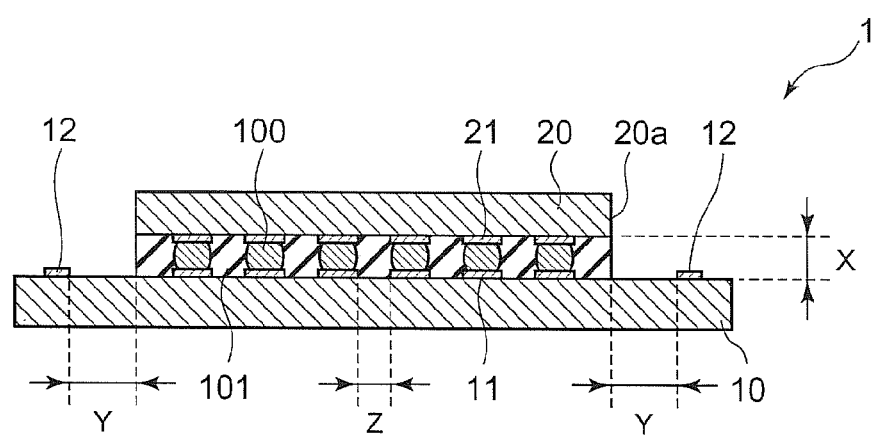

In the semiconductor electronic component 1, the semiconductor chip 10 and the semiconductor chip 20 are provided so that they are opposed to each other. In this regard, the semiconductor chip 10 and the semiconductor chip 20 are adhered to each other using the adhesive tape of the present invention. FIG. 4(*a*) is a schematic top view of the semiconductor electronic component 1 according to one embodiment of the present invention. FIG. 4(*b*) is a schematic cross sectional view taken along line A-A' in FIG. 4(*a*). In FIG. 4(*b*), the semiconductor electronic component 1 has a structure in which a circuit surface (not shown) of a first semiconductor chip 10 on which internal electrodes 11 are provided is opposed to a circuit surface (not shown) of a second semiconductor chip 20 on which internal electrodes 21 are provided. As shown in FIG. 4(*b*), the internal electrodes 11 are patterned to correspond to the internal electrodes 21, and a solder area 100 is formed between each internal electrode 11 and each internal electrode 21 which are opposed to each other. Two opposed internal electrodes are electrically connected to each other via the solder area 100. Further, the gap between the semiconductor chip 10 and the semiconductor chip 20 is filled with an insulating resin to form an insulating resin area 101, by which internal electrodes adjacent to each other are electrically insulated. On the circuit surface of the semiconductor chip 10, external electrodes 12 for connecting an integrated circuit (not shown) formed on the circuit surface of the semiconductor chip 10 to a circuit board made of silicon or the like are provided.

The distance X between the semiconductor chip 10 and the semiconductor chip 20 is not particularly limited, but is preferably decreased in order to increase integration density of semiconductor chips. For example, when using the adhesive tape of the second embodiment, the distance X is preferably 25 μm or less, more preferably 5 μm or less, and even more preferably 3 μm or less. In this regard, the distance X refers to the distance between the circuit surface of the semiconductor chip 10 and the circuit surface of the semiconductor chip 20. From the viewpoint of ensuring the connection strength between the semiconductor chips, the distance X is preferably 0.5 μm to 5 μm. When using the adhesive tape of the first embodiment, the size of the solder ball after connected is almost equal to that before connected. For example, when using the solder ball having the diameter of 50 μm, the distance X is about 25 to 50 μm, preferably 35 to 48 μm, and more preferably 40 to 45 μm.

Further, the shortest distance Y between the side surface 20*a* of the semiconductor chip 20 and the external electrode 12 provided on the circuit surface of the semiconductor chip 10 is not particularly limited, but is preferably 1 mm or less, more preferably 0.7 mm or less, and even more preferably 0.5 mm or less. In order to maintain a space for wire bonding, the shortest distance Y is generally 0.05 mm or more, but the present invention is not particularly limited thereto. In the expression "the shortest distance Y between the side surface 20*a* of the semiconductor chip 20 and the external electrode 12 provided on the semiconductor chip 10", the term "shortest" is purposely used in order to express a distance between points which are closest to each other in the case where the distance between the side surface 20*a* of the semiconductor chip 20 and the external electrode 12 provided on the circuit surface of the semiconductor chip 10 is not fixed.

Moreover, the shortest distance Z between the internal electrodes adjacent to each other (a plurality of internal electrodes are provided on the circuit surface of the semiconductor chip) is preferably 100 μm or less, more preferably 70 μm or less, and even more preferably 50 μm or less. From the viewpoint of ensuring the electrical connection reliability, the shortest distance Z is preferably 10 to 50 μm. In the expression "the shortest distance Z between the internal electrodes adjacent to each other (a plurality of internal electrodes are provided on the semiconductor chip)", the term "shortest" is purposely used in order to express a distance between points which are closest to each other in the case where the distance Z between the internal electrodes which are adjacent to each other is not fixed.

The size of the first semiconductor chip 10 is preferably larger than that of the second semiconductor chip 20, but the present invention is not particularly limited thereto. From the viewpoint of improving the integration density of the semiconductor chips, as shown in FIG. 1(*a*), the semiconductor chip 20 is preferably provided on the approximate center area of the semiconductor chip 10. Further, the external electrode 12 which is provided on the semiconductor chip 10 is preferably provided on the marginal portion of the semiconductor chip 10.

The solder area 100 is an area in which a solder component is melted and fixed. The opposed internal electrodes are conducted via this area. The insulating area 101 is an area filled with an insulating resin. The internal electrodes which are adjacent to each other are electrically insulated by this area.

The thickness of each of the semiconductor chips 10 and 20 is preferably 10 to 1000 μm, and more preferably 750 μm or less, but the present invention is not particularly limited thereto. Further, the size and materials of the internal electrodes and external electrodes are not particularly limited, and can be suitably selected depending on the intended use. Regarding the semiconductor chips, internal electrodes, external electrodes, etc. to be used in the present invention, for example, the following descriptions can be referred to: "CSP-gijutsu No Subete Part 2 (All about CSP Technique Part 2)", written by Eiji Hagimoto, published by Kogyo Chosakai Publishing, Inc., pp. 62-72, 84-88 and 39-60; "SiP-gijutsu No Subete (All about SiP Technique)", written by Takashi Akazawa, published by Kogyo Chosakai Publishing, pp. 176-188 and 192-205; and Japanese Laid-Open Patent Publication No. 2004-63753.

According to the preferred embodiment of the present invention, by using the semiconductor electronic component 1 having the above-described structure, the whole component to be packaged in the semiconductor device of the present invention can be subjected to thickness and size reduction, and moreover, the whole component to be packaged can also be subjected to weight reduction. Furthermore, since the distance between internal electrodes adjacent to each other can be reduced, the amount of information, which one package can include, can be increased.

Figure 5:
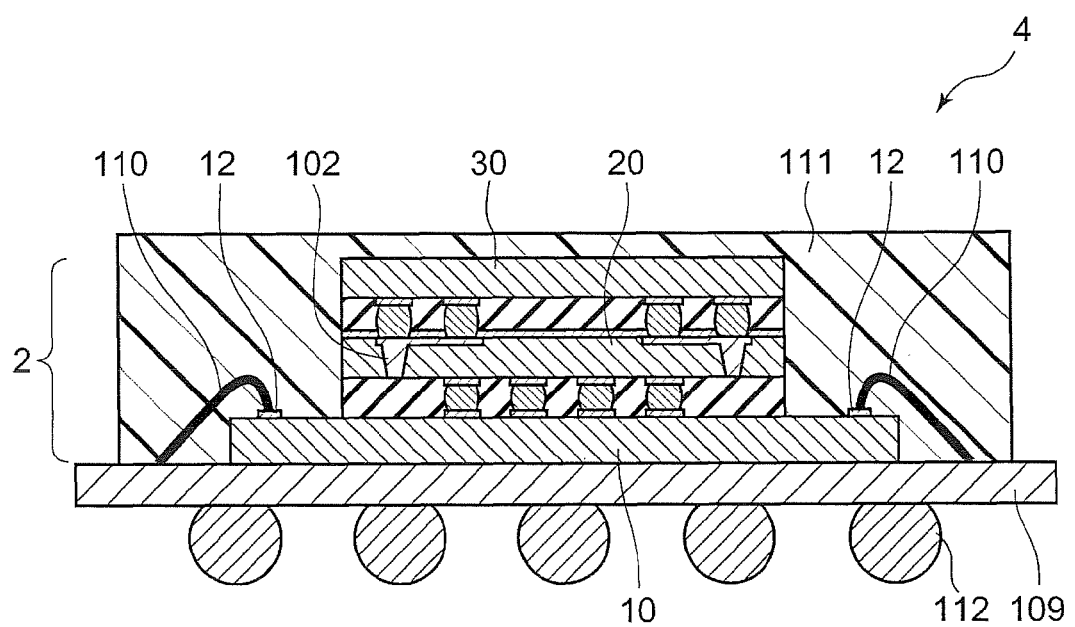
FIG. 5 shows a schematic cross sectional view of a multiple-layer stack type semiconductor device according to one embodiment of the present invention.

In the semiconductor device of the present invention, a multiple-layer stack type semiconductor electronic component may be mounted on a substrate. FIG. 5 shows a schematic cross sectional view of a semiconductor device according to one embodiment of the present invention in which a multiple-layer stack type semiconductor electronic component 2, in which another semiconductor chip is further stacked on the semiconductor electronic component 1, is mounted on a substrate. As shown in FIG. 5, an external electrode 12 provided on a semiconductor chip 10 and an electrode (not shown) provided on a circuit board 109 are electrically connected via a wire 110, and the semiconductor electronic component 2 is mounted on the circuit board 109. The semiconductor electronic component 2, circuit board 109 and wire 110 are sealed with an encapsulating resin 111. Further, a plurality of bump electrodes 112 are provided on the rear surface of the circuit board 109.

In the semiconductor electronic component 2, the semiconductor chip 10 and the semiconductor chip 20 are provided so that they are opposed to each other, and a semiconductor chip 30 is provided so that a surface opposite to the circuit surface of the semiconductor chip 20 on which the internal electrodes 21 are provided and the circuit surface (not shown) of the semiconductor chip 30 are opposed to each other.

In the semiconductor chip 20, through-holes 102 are provided in the thickness direction thereof, and they allow electrical connection between the circuit surface of the semiconductor chip 30 and the circuit surface (not shown) of the semiconductor chip 20.

Figure 6:
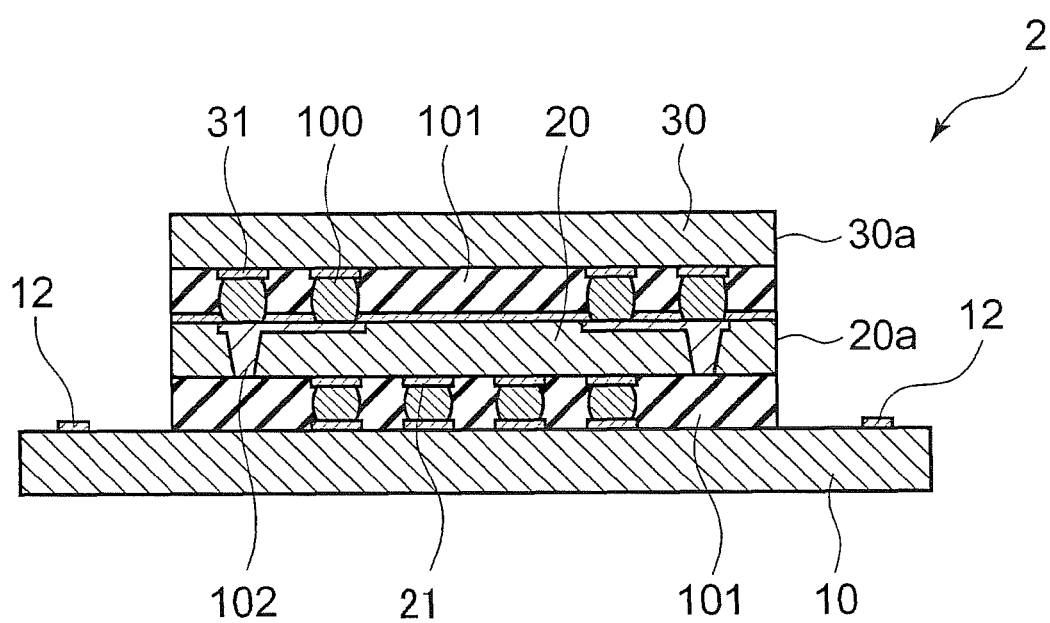
FIG. 6 shows a schematic cross sectional view of a multiple-layer stack type semiconductor electronic component to be used in a multiple-layer stack type semiconductor device according to one embodiment of the present invention.

FIG. 6 shows a schematic cross sectional view of a multiple-layer stack type semiconductor electronic component 2 according to one embodiment of the present invention. The internal electrodes 31 which are provided on the circuit surface of the semiconductor chip 30 are conducted to the circuit surface of the semiconductor chip 20 by the solder area 100 via through-holes 102 provided in the thickness direction of the semiconductor chip 20, and are electrically connected to the internal electrodes 21 on the semiconductor chip 20. In this regard, the through-holes 102 are formed, for example, by forming through holes in the thickness direction of the semiconductor chip 20 by means of drilling or the like, applying plating to inner wall surfaces of the through holes and filling the plated through holes with resin. Regarding through holes, for example, the following descriptions can be referred to: Japanese Laid-Open Patent Publication No. 2001-127243; and Japanese Laid-Open Patent Publication No. 2002-026241. The gap between the semiconductor chip 20 and the semiconductor chip 30 is filled with an insulating resin to form an insulating area 101. By the insulating area 101, internal electrodes which are adjacent to each other are electrically insulated.

In the above-described multiple-layer stack type semiconductor electronic component 2, the adhesive tape of the present invention can be used for adhesion between the semiconductor chip 20 and the semiconductor chip 30. By using the adhesive tape of the present invention, the internal electrodes 31 on the semiconductor chip 30 and the internal electrodes 21 on the semiconductor chip 20 can be electrically connected via the through-holes 102, and the gap between the semiconductor chip 20 and the semiconductor chip 30 can be sealed with a resin component.

The distance between the semiconductor chip 20 and the semiconductor chip 30 is preferably within the same range as that of the distance X between the semiconductor chip 10 and the semiconductor chip 20, but the present invention is not particularly limited thereto. Further, the shortest distance between the side surface 30a of the semiconductor chip 30 and the external electrode 12 provided on the circuit surface of the semiconductor chip 10 is preferably within the same range as that of the shortest distance Y between the side surface 20a of the semiconductor chip 20 and the external electrode 12 provided on the circuit surface of the semiconductor chip 10. Moreover, the shortest distance between the internal electrodes adjacent to each other (a plurality of internal electrodes are provided on the circuit surface of the semiconductor chip 30) is preferably within the same range as that of the shortest distance Z between the internal electrodes adjacent to each other provided on the circuit surface of the semiconductor chip 10 or 20.

In the present invention, another semiconductor chip may be further stacked on the semiconductor chip 30 using the same method. Thus, in the semiconductor device of the present invention, the integration density of semiconductor chips, which one package can include, can be further increased.

According to the preferred embodiment of the present invention, in the semiconductor device of the present invention, the integration density of semiconductor chips, which one package can include, can be increased. Therefore, sophistication and size reduction in electronic devices are realized by the semiconductor device of the present invention. The semiconductor device of the present invention can be applied to a wide range of devices such as cellular phones, digital cameras, video cameras, car navigation devices, personal computers, game machines, liquid crystal televisions, liquid crystal displays, EL displays and printers.

EXAMPLES

Hereinafter, the present invention will be specifically described by way of illustrative examples, but the present invention is not limited thereto.
1. Preparation of Adhesive Tape Examples of blending amounts and preparation methods for the adhesive tape of the present invention are shown in Examples 1 to 23. Examples 1 to 10, 20 and 21 correspond to the adhesive tape of the second embodiment of the present invention, and Examples 11 to 19, 22 and 23 correspond to the adhesive tape of the first embodiment of the present invention. Further, Comparative Examples 1 and 2 are provided for comparison with Examples 1 to 10, 20 and 21, and Comparative Examples 3 and 4 are provided for comparison with Examples 11 to 19, 22 and 23.

Examples 1 to 10, 20 and 21

Components were mixed with acetone employing the blending amounts described in Table 1 in a manner in which the solid content was 40 wt %. Each varnish thus obtained was applied on a polyester sheet subjected to antistatic treatment using a comma knife-type coater. They were dried for 3 minutes at 70° C., which is the temperature at which the above-described acetone volatilizes, and thereby adhesive tapes having the thickness of 25 μm were prepared.

TABLE 1

| Component | Structure, etc. | Example 1 | Example 2 | Example 3 | Example 4 | Example 5 | Unit (wt %) Example 6 |
|---|---|---|---|---|---|---|---|
| Acrylic resin | (Butyl acrylate) - (ethyl acrylate) - (acrylonitrile) = 30 mol %/30 mol %/40 mol %, Molecular weight: 850000 | 25.9 | 25.9 | 25.8 | | | |

TABLE 1-continued

| Component | Structure, etc. | | | | | | |
|---|---|---|---|---|---|---|---|
| High heat-resistance phenoxy resin | YL-6954, manufactured by Japan Epoxy Resins Co., Ltd. | | | | 10.0 | 25.1 | 25.1 |
| Phenoxy resin | FX-280S, manufactured by Tohto Kasei Co., Ltd. | | | | | | |
| Phenoxy resin | FX-316, manufactured by Tohto Kasei Co., Ltd. | | | | | | |
| Silicon-modified polyimide | | | | | | | |
| Epoxy resin | NC6000, manufactured by Nippon Kayaku Co., Ltd., solid trifunctional epoxy resin, softening point = 60° C. | 24.5 | 24.5 | 24.5 | | | |
| Epoxy resin | EOCN-1020-80, manufactured by Nippon Kayaku Co., Ltd., cresol novolac type epoxy resin, softening point = 80° C. | 16.3 | 13.8 | 11.3 | | | |
| Epoxy resin | RE-304S, manufactured by Nippon Kayaku Co., Ltd., liquid bis-F type epoxy resin, epoxy equivalent = 170 | 7.5 | 7.5 | 7.5 | | | |
| Epoxy resin | Epiclon 840S, Dainippon Ink and Chemicals, Inc., liquid bis-A type epoxy resin, epoxy equivalent = 180 | | | | 51.2 | 48.2 | 41.2 |
| Sebacic acid | Tokyo Chemical Industry Co., Ltd. | 5.0 | 10.0 | 15.0 | 13.4 | 3.0 | 13.4 |
| Phenolphthalin | Tokyo Chemical Industry Co., Ltd. | | | | | | |
| Gentisic acid | Midori Kagaku Co., Ltd. | | | | | | |
| Phenol novolac | PR-51470, manufactured by Sumitomo Bakelite Co., Ltd., softening point = 110° C., OH equivalent = 104 | 20.2 | 17.7 | 15.2 | | | |
| Phenol novolac | PR-53647, manufactured by Sumitomo Bakelite Co., Ltd., softening point = 95° C., OH equivalent = 104 | | | | 25.4 | 23.7 | 20.3 |
| Phenol novolac | PR-HF-3, manufactured by Sumitomo Bakelite Co., Ltd., softening point = 80° C., OH equivalent = 105 | | | | | | |
| Allylphenol-formaldehyde resin | MEH-8000H, manufactured by Meiwa Plastic Industries, Ltd. | | | | | | |
| Silane coupling agent | KBM-403E, manufactured by Shin-Etsu Chemical Co., Ltd., epoxysilane | 0.1 | 0.1 | 0.1 | | | |
| Silane coupling agent | KBM-573, manufactured by Shin-Etsu Chemical Co., Ltd., aromatic secondary aminosilane | 0.35 | 0.35 | 0.35 | | | |
| Imidazole | 2PHZ-PW, manufactured by Shikoku Chemicals Corporation | 0.15 | 0.15 | 0.15 | 0.008 | 0.008 | 0.008 |
| Solder powder | Sn/Bi = 42/58, melting point = 138° C., average particle diameter: 12 μm | 60 *1 | 60 *1 | 60 *1 | 60 *1 | 60 *1 | 60 *1 |
| Film forming resin (A) | | 25.9 | 25.9 | 25.8 | 10.0 | 25.1 | 25.1 |
| Curable resin (B) | | 68.7 | 63.7 | 58.7 | 76.6 | 71.9 | 61.5 |
| Curing agent (C) having flux activity | | 5.0 | 10.0 | 15.0 | 13.4 | 3.0 | 13.4 |
| Melt viscosity (Pa · s) at solder melting point (Sn/Bi = 42/58, 138° C.) | | 340 | 460 | 630 | 530 | 890 | 970 |
| Melt viscosity (Pa · s) at solder melting point (Sn/Ag = 96.5/3.5, 223° C.) | | — | — | — | — | — | — |
| Solder wet-spreading ratio (%) | Sn/Ag/Cu = 96.5/3.0/0.5 | — | — | — | — | — | — |
| | Sn/Ag = 96.5/3.5 | — | — | — | — | — | — |

| Component | Structure, etc. | Example 7 | Example 8 | Example 9 | Example 10 | Example 20 | Example 21 |
|---|---|---|---|---|---|---|---|
| Acrylic resin | (Butyl acrylate) - (ethyl acrylate) - (acrylonitrile) = 30 mol %/30 mol %/40 mol %, Molecular weight: 850000 | | | | | 20.3 | |
| High heat-resistance phenoxy resin | YL-6954, manufactured by Japan Epoxy Resins Co., Ltd. | 25.1 | 25.1 | 25.1 | 45.0 | | |
| Phenoxy resin | FX-280S, manufactured by Tohto Kasei Co., Ltd. | | | | | | 10.15 |
| Phenoxy resin | FX-316, manufactured by Tohto Kasei Co., Ltd. | | | | | | 10.15 |
| Silicon-modified polyimide | | | | | | | |
| Epoxy resin | NC6000, manufactured by Nippon Kayaku Co., Ltd., solid trifunctional epoxy resin, softening point = 60° C. | | | | | 30.0 | 30.0 |
| Epoxy resin | EOCN-1020-80, manufactured by Nippon Kayaku Co., Ltd., cresol novolac type epoxy resin, softening point = 80° C. | | | | | 20.1 | 20.1 |
| Epoxy resin | RE-304S, manufactured by Nippon Kayaku Co., Ltd., liquid bis-F type epoxy resin, epoxy equivalent = 170 | | | | | | |

TABLE 1-continued

| Component | Structure, etc. | | | | | | |
|---|---|---|---|---|---|---|---|
| Epoxy resin | Epiclon 840S, Dainippon Ink and Chemicals, Inc., liquid bis-A type epoxy resin, epoxy equivalent = 180 | 41.2 | 41.2 | 38.0 | 27.9 | | |
| Sebacic acid | Tokyo Chemical Industry Co., Ltd. | | | 18.0 | 13.4 | 5.0 | 5.0 |
| Phenolphthalin | Tokyo Chemical Industry Co., Ltd. | 13.4 | | | | | |
| Gentisic acid | Midori Kagaku Co., Ltd. | | 13.4 | | | | |
| Phenol novolac | PR-51470, manufactured by Sumitomo Bakelite Co., Ltd., softening point = 110° C., OH equivalent = 104 | | | | | | |
| Phenol novolac | PR-53647, manufactured by Sumitomo Bakelite Co., Ltd., softening point = 95° C., OH equivalent = 104 | 20.3 | 20.3 | 18.7 | 13.7 | | |
| Phenol novolac | PR-HF-3, manufactured by Sumitomo Bakelite Co., Ltd., softening point = 80° C., OH equivalent = 105 | | | | | 8.1 | 8.1 |
| Allylphenol-formaldehyde resin | MEH-8000H, manufactured by Meiwa Plastic Industries, Ltd. | | | | | 16.1 | 16.1 |
| Silane coupling agent | KBM-403E, manufactured by Shin-Etsu Chemical Co., Ltd., epoxysilane | | | | | 0.35 | 0.35 |
| Silane coupling agent | KBM-573, manufactured by Shin-Etsu Chemical Co., Ltd., aromatic secondary aminosilane | | | | | | |
| Imidazole | 2PHZ-PW, manufactured by Shikoku Chemicals Corporation | 0.008 | 0.008 | 0.008 | 0.008 | 0.14 | 0.14 |
| Solder powder | Sn/Bi = 42/58, melting point = 138° C., average particle diameter: 12 μm | 60 *1 | 60 *1 | 60 *1 | 60 *1 | 60 *1 | 60 *1 |
| Film forming resin (A) | | 25.1 | 25.1 | 25.1 | 45.0 | 20.3 | 20.3 |
| Curable resin (B) | | 61.5 | 61.5 | 56.7 | 41.6 | 74.4 | 74.4 |
| Curing agent (C) having flux activity | | 13.4 | 13.4 | 18.0 | 13.4 | 5.0 | 5.0 |
| Melt viscosity (Pa · s) at solder melting point (Sn/Bi = 42/58, 138° C.) | | 1260 | 1040 | 1010 | 1420 | 55 | 7 |
| Melt viscosity (Pa · s) at solder melting point (Sn/Ag = 96.5/3.5, 223° C.) | | — | — | — | — | — | — |
| Solder wet-spreading ratio (%) | Sn/Ag/Cu = 96.5/3.0/0.5 | — | — | — | — | — | — |
| | Sn/Ag = 96.5/3.5 | — | — | — | — | — | — |

Examples 11 to 19, 22 and 23

Components were mixed with NMP (N-methyl-2-pyrrolidone) employing the blending amounts described in Table 2 in a manner in which the solid content was 40 wt %. Each varnish thus obtained was applied on a polyester sheet subjected to antistatic treatment using a comma knife-type coater. They were dried for 3 minutes at 150° C., which is the temperature at which the above-described NMP volatilizes, and thereby adhesive tapes having the thickness of 50 μm were prepared. Silicon-modified polyimide blended in Examples 18 and 19 was synthesized as described below.

(Synthesis of Silicon-Modified Polyimide)

200 g of dehydrated and purified N-methyl-2-pyrrolidone (NMP) was put into a four-neck flask equipped with a dry nitrogen gas introduction tube, a cooler, a thermometer and a stirring machine, and it was vigorously stirred for 10 minutes in nitrogen gas stream.

Next, 29 g of 1,3-bis-(3-aminophenoxy)benzene, 10 g of 3,3-(1,1,3,3,5,5,7,7,9,9,11,11,13,13,15,15,17,17,19,19-eicosamethyl-1,19-decasiloxanediyl)bis-1-propaneamine, and 4 g of 1,3-bis(3-aminopropyl)-1,1,3,3-tetramethyldisiloxane) were added thereto, and the mixture was stirred to obtain a homogeneous state. After it was homogeneously dissolved, a system was cooled to 5° C. with an ice water bath. 40 g of 4,4'-oxydiphthalic dianhydride (powdered state) was added to the mixture over 15 minutes, and after that, stirring was continued for 2 hours. During this period, the flask was maintained at 5° C.

After that, the nitrogen gas introduction tube and the cooler were removed therefrom, and a Dean-Stark tube filled with xylene was attached to the flask. 50 g of toluene was added to the system. After the replacement of the ice water bath with an oil bath, the system was heated to 170° C., and water generated was removed from the system. After heating for 4 hours, generation of water from the system was not observed.

After cooled, the reaction solution was put into a large amount of methanol to separate out silicon-modified polyimide. After the solid content was filtered, drying under reduced pressure was performed at 80° C. for 12 hours to remove a solvent, and thereby a solid resin was obtained. When measuring infrared absorption spectrum according to the KBr tablet method, absorption at 5.6 μm derived from cyclic imide bond was confirmed, but absorption at 6.06 μm derived from amide bond was not confirmed. Therefore, almost 100% imidization of the resin was confirmed.

TABLE 2

| | | | | | | | Unit (wt %) |
|---|---|---|---|---|---|---|---|
| Component | Structure, etc. | Example 11 | Example 12 | Example 13 | Example 14 | Example 15 | Example 16 |
| Acrylic resin | (Butyl acrylate) - (ethyl acrylate) - (acrylonitrile) = 30 mol %/30 mol %/40 mol %, Molecular weight: 850000 | | | | | | |

TABLE 2-continued

| Component | Structure, etc. | | | | | | |
|---|---|---|---|---|---|---|---|
| High heat-resistance phenoxy resin | YL-6954, manufactured by Japan Epoxy Resins Co., Ltd. | 10.0 | 25.1 | 25.1 | 25.1 | 25.1 | 25.1 |
| Phenoxy resin | FX-280S, manufactured by Tohto Kasei Co., Ltd. | | | | | | |
| Phenoxy resin | FX-316, manufactured by Tohto Kasei Co., Ltd. | | | | | | |
| Silicon-modified polyimide | | | | | | | |
| Epoxy resin | NC6000, manufactured by Nippon Kayaku Co., Ltd., solid trifunctional epoxy resin, softening point = 60° C. | | | | | | |
| Epoxy resin | EOCN-1020-80, manufactured by Nippon Kayaku Co., Ltd., cresol novolac type epoxy resin, softening point = 80° C. | | | | | | |
| Epoxy resin | RE-304S, manufactured by Nippon Kayaku Co., Ltd., liquid bis-F type epoxy resin, epoxy equivalent = 170 | | | | | | |
| Epoxy resin | Epiclon 840S, Dainippon Ink and Chemicals, Inc., liquid bis-A type epoxy resin, epoxy equivalent = 180 | 51.2 | 48.2 | 41.2 | 41.2 | 41.2 | 38.2 |
| Sebacic acid | Tokyo Chemical Industry Co., Ltd. | | | | | 13.4 | |
| Phenolphthalin | Tokyo Chemical Industry Co., Ltd. | 13.4 | 3.0 | 13.4 | | | 18.0 |
| Gentisic acid | Midori Kagaku Co., Ltd. | | | | 13.4 | | |
| Phenol novolac | PR-51470, manufactured by Sumitomo Bakelite Co., Ltd., softening point = 110° C., OH equivalent = 104 | | | | | | |
| Phenol novolac | PR-53647, manufactured by Sumitomo Bakelite Co., Ltd., softening point = 95° C., OH equivalent = 104 | 25.4 | 23.7 | 20.3 | 20.3 | 20.3 | 18.7 |
| Phenol novolac | PR-HF-3, manufactured by Sumitomo Bakelite Co., Ltd., softening point = 80° C., OH equivalent = 105 | | | | | | |
| Allylphenol-formaldehyde resin | MEH-8000H, manufactured by Meiwa Plastic Industries, Ltd. | | | | | | |
| Silane coupling agent | KBM-403E, manufactured by Shin-Etsu Chemical Co., Ltd., epoxysilane | | | | | | |
| Silane coupling agent | KBM-573, manufactured by Shin-Etsu Chemical Co., Ltd., aromatic secondary aminosilane | | | | | | |
| Imidazole | 2PHZ-PW, manufactured by Shikoku Chemicals Corporation | 0.008 | 0.008 | 0.008 | 0.008 | 0.008 | 0.008 |
| Solder powder | Sn/Bi = 42/58, melting point = 138° C., average particle diameter: 12 μm | — | — | — | — | — | — |
| Film forming resin (A) | | 10.0 | 25.1 | 25.1 | 25.1 | 25.1 | 25.1 |
| Curable resin (B) | | 76.6 | 71.9 | 61.5 | 61.5 | 61.5 | 56.9 |
| Curing agent (C) having flux activity | | 13.4 | 3.0 | 13.4 | 13.4 | 13.4 | 18.0 |
| Melt viscosity (Pa · s) at solder melting point (Sn/Bi = 42/58, 138° C.) | | — | — | — | — | — | — |
| Melt viscosity (Pa · s) at solder melting point (Sn/Ag = 96.5/3.5, 223° C.) | | 10 | 40 | 70 | 50 | 110 | 90 |
| Solder wet-spreading ratio (%) | Sn/Ag/Cu = 96.5/3.0/0.5 | 57 | 43 | 53 | 66 | 55 | 59 |
| | Sn/Ag = 96.5/3.5 | 59 | 45 | 56 | 68 | 58 | 62 |

| Component | Structure, etc. | Example 17 | Example 18 | Example 19 | Example 22 | Example 23 |
|---|---|---|---|---|---|---|
| Acrylic resin | (Butyl acrylate) - (ethyl acrylate) - (acrylonitrile) = 30 mol %/30 mol %/40 mol %, Molecular weight: 850000 | | | | 34.5 | 17.25 |
| High heat-resistance phenoxy resin | YL-6954, manufactured by Japan Epoxy Resins Co., Ltd. | 45.0 | | | | 17.25 |
| Phenoxy resin | FX-280S, manufactured by Tohto Kasei Co., Ltd. | | | | | |
| Phenoxy resin | FX-316, manufactured by Tohto Kasei Co., Ltd. | | | | | |
| Silicon-modified polyimide | | 44.7 | 33.3 | | | |
| Epoxy resin | NC6000, manufactured by Nippon Kayaku Co., Ltd., solid trifunctional epoxy resin, softening point = 60° C. | | | | 55.45 | 55.45 |
| Epoxy resin | EOCN-1020-80, manufactured by Nippon Kayaku Co., Ltd., cresol novolac type epoxy resin, softening point = 80° C. | | | | | |
| Epoxy resin | RE-304S, manufactured by Nippon Kayaku Co., Ltd., liquid bis-F type epoxy resin, epoxy equivalent = 170 | | | | | |

TABLE 2-continued

| | | | | | | |
|---|---|---|---|---|---|---|
| Epoxy resin | Epiclon 840S, Dainippon Ink and Chemicals, Inc., liquid bis-A type epoxy resin, epoxy equivalent = 180 | 27.9 | 41.2 | 5.1 | | |
| Sebacic acid | Tokyo Chemical Industry Co., Ltd. | | | | | |
| Phenolphthalin | Tokyo Chemical Industry Co., Ltd. | 13.4 | | | 15.2 | 15.2 |
| Gentisic acid | Midori Kagaku Co., Ltd. | | 8.2 | 16.2 | | |
| Phenol novolac | PR-51470, manufactured by Sumitomo Bakelite Co., Ltd., softening point = 110° C., OH equivalent = 104 | | | | | |
| Phenol novolac | PR-53647, manufactured by Sumitomo Bakelite Co., Ltd., softening point = 95° C., OH equivalent = 104 | 13.7 | 5.9 | 45.4 | 12.1 | 12.1 |
| Phenol novolac | PR-HF-3, manufactured by Sumitomo Bakelite Co., Ltd., softening point = 80° C., OH equivalent = 105 | | | | | |
| Allylphenol-formaldehyde resin | MEH-8000H, manufactured by Meiwa Plastic Industries, Ltd. | | | | | |
| Silane coupling agent | KBM-403E, manufactured by Shin-Etsu Chemical Co., Ltd., epoxysilane | | | | 0.5 | 0.5 |
| Silane coupling agent | KBM-573, manufactured by Shin-Etsu Chemical Co., Ltd., aromatic secondary aminosilane | | | | | |
| Imidazole | 2PHZ-PW, manufactured by Shikoku Chemicals Corporation | | | | 0.1 | 0.1 |
| Solder powder | Sn/Bi = 42/58, melting point = 138° C., average particle diameter: 12 μm | — | — | — | — | — |
| Film forming resin (A) | | 45.0 | 44.7 | 33.3 | 34.5 | 34.5 |
| Curable resin (B) | | 41.6 | 47.1 | 50.5 | 67.7 | 67.7 |
| Curing agent (C) having flux activity | | 13.4 | 8.2 | 16.2 | 15.2 | 15.2 |
| Melt viscosity (Pa · s) at solder melting point (Sn/Bi = 42/58, 138° C.) | | — | — | — | — | — |
| Melt viscosity (Pa · s) at solder melting point (Sn/Ag = 96.5/3.5, 223° C.) | | 310 | 1180 | 760 | 180000 | 150000 |
| Solder wet-spreading ratio (%) | Sn/Ag/Cu = 96.5/3.0/0.5 | 49 | 47 | 54 | 54 | 56 |
| | Sn/Ag = 96.5/3.5 | 51 | 50 | 55 | 55 | 58 |

Comparative Examples 1 and 2

Components were mixed with acetone employing the blending amounts described in Table 3 in a manner in which the solid content was 40 wt %. Each varnish thus obtained was applied on a polyester sheet subjected to antistatic treatment using a comma knife-type coater. They were dried for 3 minutes at 70° C., which is the temperature at which the above-described acetone volatilizes, and thereby adhesive tapes having the thickness of 25 μm were prepared.

Comparative Examples 3 and 4

Components were mixed with NMP (N-methyl-2-pyrrolidone) employing the blending amounts described in Table 3 in a manner in which the solid content was 40 wt %. Each varnish thus obtained was applied on a polyester sheet subjected to antistatic treatment using a comma knife-type coater. They were dried for 3 minutes at 150° C., which is the temperature at which the above-described NMP volatilizes, and thereby adhesive tapes having the thickness of 50 μm were prepared.

TABLE 3

| | | | | | Unit (wt %) |
|---|---|---|---|---|---|
| Component | Structure, etc. | Comp. Ex. 1 | Comp. Ex. 2 | Comp. Ex. 3 | Comp. Ex. 4 |
| Acrylic resin | (Butyl acrylate)-(ethyl acrylate)-(acrylonitrile) = 30 mol %/30 mol %/40 mol %, Molecular weight: 850000 | 25.1 | 95.0 | 25.1 | 95.0 |
| High heat-resistance phenoxy resin | YL-6954, manufactured by Japan Epoxy Resins Co., Ltd. | | | | |
| Phenoxy resin | FX-280S, manufactured by Tohto Kasei Co., Ltd. | | | | |
| Phenoxy resin | FX-316, manufactured by Tohto Kasei Co., Ltd. | | | | |
| Silicon-modified polyimide | | | | | |
| Epoxy resin | NC6000, manufactured by Nippon Kayaku Co., Ltd., solid trifunctional epoxy resin, softening point = 60° C. | | | | |
| Epoxy resin | EOCN-1020-80, manufactured by Nippon Kayaku Co., Ltd., cresol novolac type epoxy resin, softening point = 80° C. | | | | |
| Epoxy resin | RE-304S, manufactured by Nippon Kayaku Co., Ltd., liquid bis-F type epoxy resin, epoxy equivalent = 170 | | | | |
| Epoxy resin | Epiclon 840S, Dainippon Ink and Chemicals, Inc., liquid bis-A type epoxy resin, epoxy equivalent = 180 | 54.6 | | 54.6 | |
| Sebacic acid | Tokyo Chemical Industry Co., Ltd. | | | | |
| Phenolphthalin | Tokyo Chemical Industry Co., Ltd. | | | 5.0 | 5.0 |
| Gentisic acid | Midori Kagaku Co., Ltd. | | | | |

TABLE 3-continued

| Component | Structure, etc. | Comp. Ex. 1 | Comp. Ex. 2 | Comp. Ex. 3 | Unit (wt %) Comp. Ex. 4 |
|---|---|---|---|---|---|
| Phenol novolac | PR-51470, manufactured by Sumitomo Bakelite Co., Ltd., softening point = 110° C., OH equivalent = 104 | 20.3 | | 20.3 | |
| Phenol novolac | PR-53647, manufactured by Sumitomo Bakelite Co., Ltd., softening point = 95° C., OH equivalent = 104 | | | | |
| Phenol novolac | PR-HF-3, manufactured by Sumitomo Bakelite Co., Ltd., softening point = 80° C., OH equivalent = 105 | | | | |
| Allylphenol-formaldehyde resin | MEH-8000H, manufactured by Meiwa Plastic Industries, Ltd. | | | | |
| Silane coupling agent | KBM-403E, manufactured by Shin-Etsu Chemical Co., Ltd., epoxysilane | | | | |
| Silane coupling agent | KBM-573, manufactured by Shin-Etsu Chemical Co., Ltd., aromatic secondary aminosilane | | | | |
| Imidazole | 2PHZ-PW, manufactured by Shikoku Chemicals Corporation, 2-phenyl-4,5-dihydroxymethyl imidazole | 0.008 | 0.008 | 0.008 | 0.008 |
| Solder powder | Sn/Bi = 42/58, melting point = 138° C., average particle diameter: 12 μm | 60 *1 | 60 *1 | — | — |
| Film forming resin (A) | | 25.1 | 95.0 | 25.1 | 95.0 |
| Curable resin (B) | | 74.9 | 0.0 | 74.9 | 0.0 |
| Curing agent (C) having flux activity | | 0.0 | 5.0 | 0.0 | 5.0 |
| Melt viscosity (Pa · s) at solder melting point (Sn/Bi = 42/58, 138° C.) | | 540 | 22390 | — | — |
| Melt viscosity (Pa · s) at solder melting point (Sn/Ag = 96.5/3.5, 223° C.) | | — | — | 30 | 12540 |
| Solder wet-spreading ratio (%) | Sn/Ag/Cu = 96.5/3.0/0.5 | — | — | — | — |
| | Sn/Ag = 96.5/3.5 | — | — | — | — |

[1] Measurement of Melt Viscosity at Solder Melting Point

The melt viscosity of each of the adhesive tapes obtained in Examples 1 to 23 and Comparative Examples 1 to 4 at the solder melting point was measured as described below. Regarding Examples 1 to 10, 20 and 21 and Comparative Examples 1 and 2, the melt viscosity was measured under the measurement conditions 1 described below. Regarding Examples 11 to 19, 22 and 23 and Comparative Examples 3 and 4, the melt viscosity was measured under the measurement conditions 2 described below.

(Measurement Conditions 1)

The adhesive tape having the thickness of 100 μm was subjected to measurement using a viscoelasticity measuring apparatus (JASCO International Co., Ltd.) (rate of temperature increase: 10° C./min, frequency: 0.1 Hz, measuring stress by constant distortion), and the viscosity at the atmospheric temperature of 138° C., which is the melting point of Sn/Bi (=42/58), was regarded as a measurement value.

(Measurement Conditions 2)

The adhesive tape having the thickness of 100 μm was subjected to measurement using a viscoelasticity measuring apparatus (JASCO International Co., Ltd.) (rate of temperature increase: 30° C./min, frequency: 1.0 Hz, measuring stress by constant distortion), and the viscosity at the atmospheric temperature of 223° C., which is the melting point of Sn/Ag (=96.5/3.5), was regarded as a measurement value.

[2] Measurement of Solder Wet-Spreading Ratio

The solder wet-spreading ratio of each of the adhesive tapes obtained in Examples 11 to 19, 22 and 23 and Comparative Examples 3 and 4 was measured as described below.

(1) The adhesive tape having the thickness of 15 μm was attached to a bare Cu plate (manufactured by Hirai Seimitsu Kogyo Co., Ltd.).

(2) On the adhesive tape, the following solder balls having the diameter of 500 μm are stationarily placed.

(i) "M31" (Sn/Ag/Cu, melting point: 217° C., manufactured by Senju Metal Industry Co., Ltd.)

(ii) "L20" (Sn/Bi, melting point: 138° C., manufactured by Senju Metal Industry Co., Ltd.)

(3) Based on ASTM B 545, a hot plate is heated to a temperature which is 30° C. higher than the melting point of each of the solders, and the above-described sample is heated on the hot plate for 20 seconds.

(4) The height of the solder balls wet-spread on the bare Cu plate is measured.

(5) The solder wet-spreading ratio is calculated using the following formula (I):

$$\text{Solder wet-spreading ratio (\%)} = [\{(\text{diameter of solder ball}) - (\text{thickness of solder after wet spreading})\} / (\text{diameter of solder ball})] \times 100 \quad (I)$$

The measurement results of the melt viscosity and the solder wet-spreading ratio at the solder melting point are shown in Tables 2 and 3.

2. Production of Semiconductor Electronic Components

Figure 7:
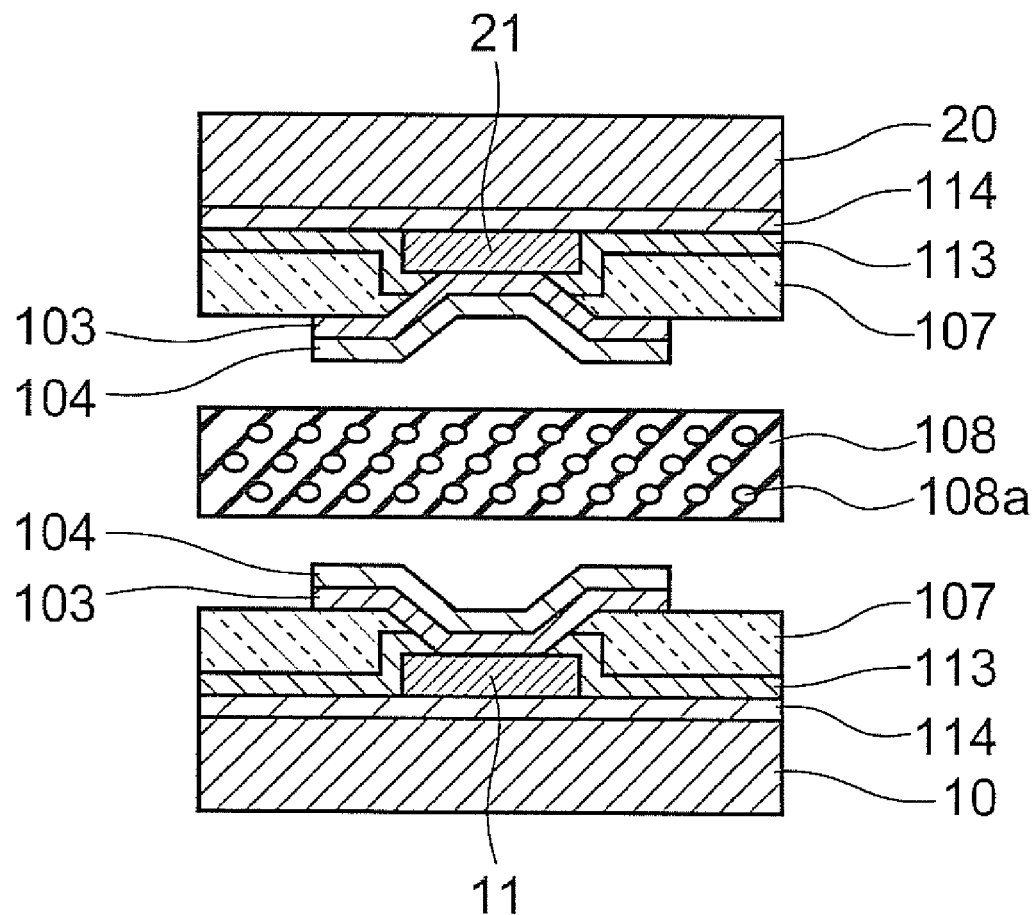
FIG. 7 shows an explanatory drawing for steps in a method for producing a semiconductor electronic component to be used in the semiconductor device of the Examples of the present invention.
Figure 8:
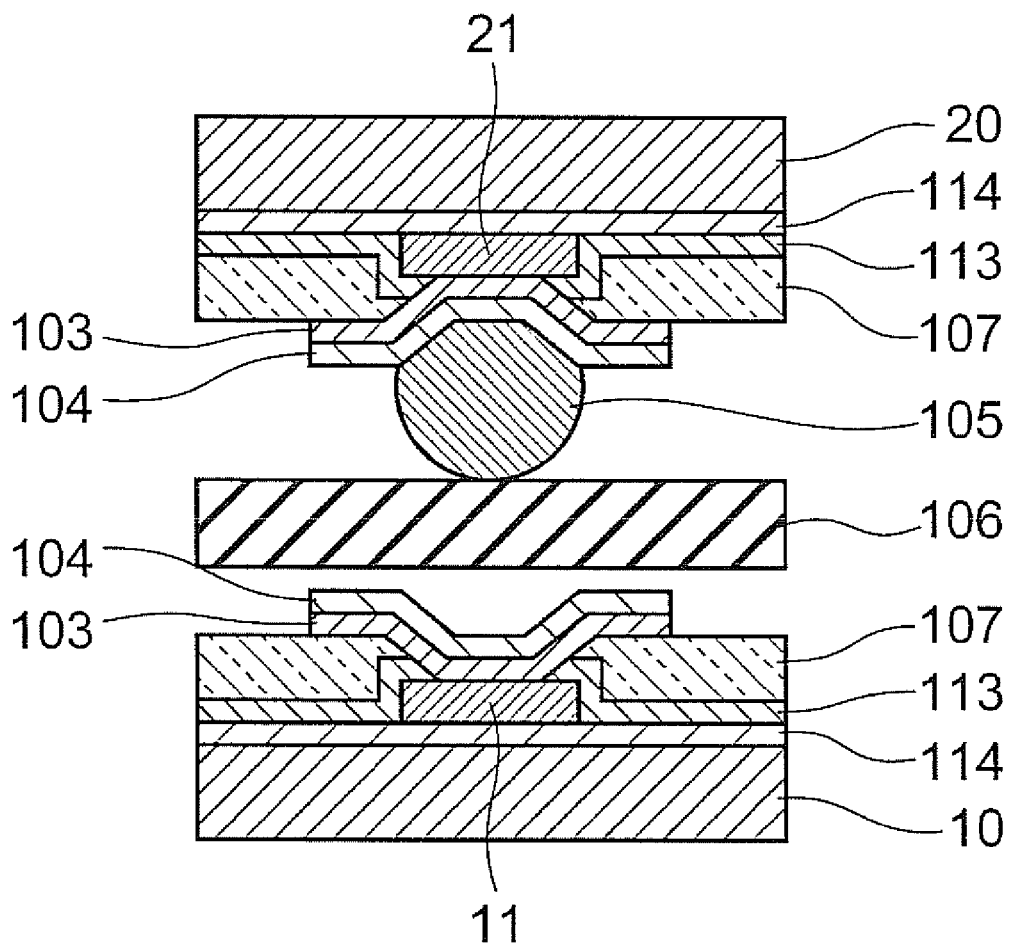
FIG. 8 shows an explanatory drawing for steps in a method for producing a semiconductor electronic component to be used in the semiconductor device of the Examples of the present invention.

Next, semiconductor electronic components having the structure shown in FIG. 4 were produced using the adhesive tapes obtained in Examples 1 to 23. FIG. 7 shows an explanatory drawing for steps in the production methods in Examples 1 to 10, 20 and 21. FIG. 8 shows an explanatory drawing for steps in the production methods in Examples 11 to 19, 22 and 23. Hereinafter, Examples 1 to 10, 20 and 21 will be described with reference to FIG. 7, and Examples 11 to 19, 22 and 23 will be described with reference to FIG. 8.

Examples 1 to 10, 20 and 21

Firstly, a thermally-oxidized film 114 having the thickness of 0.4 μm was formed on each of the whole circuit surfaces of the semiconductor chips 10 and 20. Next, as a metal layer, aluminum/0.5 Cu was sputtered to have the thickness of 0.4 μm. Utilizing resist, portions other than those required for wiring were dry-etched to form internal electrodes 11 and 21. After removing mask, a SiN film (passivating layer) 113 having the thickness of 0.2 μm was formed on the whole surface using the CVD method. Further, utilizing resist, the metal layer portion (internal electrode surface) was soft-etched. Next, a polyimide layer having the thickness of 3 μm was applied and developed, and thereby the metal layer portion was opened. Further, the polyimide layer was cured to form a stress relaxation layer (protecting layer) 107. Next, Ti having the thickness of 0.05 μm and Cu having the thickness of 1 μm were sputtered in this order to form UBM layers 103 and 104. Thus, on each of the semiconductor chips 10 and 20, a connection pad (pad size: 60μ×60μ, distance between pads:

40 μm, pad pitch: 100 μm) was formed (semiconductor chip 10: 10 mm×10 mm, thickness: 725 μm; semiconductor chip 20: 6 mm×6 mm, thickness: 725 μm). In Examples 1 to 10, an external electrode was disposed on the semiconductor chip 10 so that the distance Y became 250 μm.

Subsequently, each of the adhesive tapes obtained in Examples 1 to 10, 20 and 21 was cut to a size equal to the connection pad surface of the semiconductor chip 10 (6 mm×6 mm), and attachment thereof was performed on a heat board at 80° C. After that, a polyester sheet (substrate) was peeled off. Next, the connection pad surface of the semiconductor chip 20 and the connection pad surface of the semiconductor chip 10 were arranged to be opposed to each other, and alignment was carried out. In the alignment, a camera attached to a flip chip bonder (manufactured by Shibuya Kogyo Co., Ltd., DB200) recognized alignment marks on the connection pad surfaces of the chips. After that, using this flip chip bonder, thermocompression bonding was carried out under the first heating conditions described in Table 4, and solder connection was performed. Further, an oven was set to meet the second heating conditions described in Table 4, and by predetermined heat history, an adhesive was cured. Thus, semiconductor electronic components having the distances X, Y and Z shown in Table 4 were obtained.

Comparative Examples 1 and 2

Semiconductor electronic components were obtained in a manner similar to that in Examples 1 to 10, 20 and 21 except that the adhesive tapes obtained in Comparative Examples 1 and 2 were used instead of the adhesive tapes obtained in Examples 1 to 10, 20 and 21.

Examples 11 to 19, 22 and 23

Firstly, on each of the circuit surfaces of the semiconductor chips 10 and 20, a connection pad (pad size: 60μ×60μ, distance between pads: 40 μm, pad pitch: 100 μm) was formed in a manner similar to that in Examples 1 to 10, 20 and 21. Further, on the connection pad formed on the semiconductor chip 20, utilizing a mask in which the portion of UBM layer 104 was opened, a Sn—Ag solder ball having the diameter of 50 μm was mounted on the UBM 104 on which flux was applied. Next, by means of reflow, the solder ball and the UBM layer 104 were joined together to form a solder bump 105 (see FIG. 8). As the semiconductor chips 10 and 20, the same chips as those in Examples 1 to 10, 20 and 21 were used. In Examples 11 to 19, 22 and 23, an external electrode was provided on the semiconductor chip 10 so that the distance Y became 250 μm.

Subsequently, each of the adhesive tapes obtained in Examples 11 to 19, 22 and 23 was cut to a size equal to the connection pad surface of the semiconductor chip 10 (6 mm×6 mm), and attachment thereof was performed on a heat board at 80° C. After that, a polyester sheet (substrate) was peeled off. Next, the connection pad surface of the semiconductor chip 20 and the connection pad surface of the semiconductor chip 10 were arranged to be opposed to each other, and alignment was carried out in a manner similar to that in Examples 1 to 10, 20 and 21. After that, using the flip chip bonder, thermocompression bonding was carried out under the first heating conditions described in Table 5, and solder connection was performed. Further, the oven was set to meet the second heating conditions described in Table 5, and by predetermined heat history, an adhesive was cured. Thus, semiconductor electronic components having the distances X, Y and Z shown in Table 5 were obtained.

Comparative Examples 3 and 4

Semiconductor electronic components were obtained in a manner similar to that in Examples 11 to 19, 22 and 23 except that the adhesive tapes obtained in Comparative Examples 3 and 4 were used instead of the adhesive tapes obtained in Examples 11 to 19, 22 and 23.

(1) Measurement of Distances X, Y and Z

The obtained semiconductor electronic component was embedded in thermosetting epoxy resin (Nippon Kayaku Co., Ltd.: RE-403S, Fuji Kasei Kogyo Co., Ltd.: Fujicure 5300), and cross-sectional polishing was carried out. The obtained section was projected using a digital microscope manufactured by Keyence Corporation. Utilizing an image-editing software VHS-500, the distances X, Y and Z were calculated.

(2) Conductivity Test

Using a hand tester, the connection ratio of the semiconductor chip of the obtained semiconductor electronic component was measured after the lamination of the semiconductor chip and 1000 hours after the heat cycle test (a cycle at −65° C. for 1 hour and a cycle at 150° C. for 1 hour were alternately repeated). The connection ratio was calculated using the following formula:

Connection ratio (%)={(Number of conducted pads)/(Number of measured pads)}×100

Evaluation criteria are as follows:
○: connection ratio of 100%
x: connection ratio of less than 100%

(3) Evaluation of Contamination of External Electrodes

The external electrode 12 (wire-bonding pad) on the semiconductor chip 10 of the obtained semiconductor electronic component was observed using a metallographic microscope to confirm whether or not it was contaminated with the adhesive tape. The evaluation criteria are as follows:
Contamination of external electrode is absent (melted components of the adhesive tape did not reach the external electrode)
Contamination of external electrode is present (melted components of the adhesive tape reached the external electrode)

Results thereof are as shown in Tables 4 and 5.

TABLE 4

|  |  | Example 1 | Example 2 | Example 3 | Example 4 | Example 5 | Example 6 | Example 7 |
|---|---|---|---|---|---|---|---|---|
| First heating | Temperature |  |  |  | 160° C. |  |  |  |
|  | Pressure |  |  |  | 10 kgf |  |  |  |
|  | Time |  |  |  | 60 sec |  |  |  |
| Second heating | Temperature |  |  |  | 180° C. |  |  |  |
|  | Pressure |  |  |  | 0 kgf |  |  |  |
|  | Time |  |  |  | 60 min |  |  |  |
| Distance X (μm) |  | 0.4 | 0.5 | 0.6 | 0.5 | 0.9 | 1.0 | 1.4 |
| Distance Y (μm) |  | 250 | 250 | 250 | 250 | 250 | 250 | 250 |
| Distance Z (μm) |  | 40 | 40 | 40 | 40 | 40 | 40 | 40 |

TABLE 4-continued

| | | | | | | | | |
|---|---|---|---|---|---|---|---|---|
| Conductivity test | Primary stage | ○ | ○ | ○ | ○ | ○ | ○ | ○ |
| | 1000 hours after heat cycle test | ○ | ○ | ○ | ○ | ○ | ○ | ○ |
| Contamination of external electrode | | Absent | Absent | Absent | Absent | Absent | Absent | Absent |

| | | Example 8 | Example 9 | Example 10 | Example 20 | Example 21 | Comp. Ex. 1 | Comp. Ex. 2 |
|---|---|---|---|---|---|---|---|---|
| First heating | Temperature | | | 160° C. | | | 160° C. | |
| | Pressure | | | 10 kgf | | | 10 kgf | |
| | Time | | | 60 sec | | | 60 sec | |
| Second heating | Temperature | | | 180° C. | | | 180° C. | |
| | Pressure | | | 0 kgf | | | 0 kgf | |
| | Time | | | 60 min | | | 60 min | |
| Distance X (μm) | | 1.1 | 1.1 | 1.6 | 0.3 | 0.3 | 0.7 | 26.8 |
| Distance Y (μm) | | 250 | 250 | 250 | 250 | 250 | 250 | 250 |
| Distance Z (μm) | | 40 | 40 | 40 | 40 | 40 | 40 | 40 |
| Conductivity test | Primary stage | ○ | ○ | ○ | ○ | ○ | ○ | X |
| | 1000 hours after heat cycle test | ○ | ○ | ○ | ○ | ○ | X | X |
| Contamination of external electrode | | Absent | Absent | Absent | Absent | Absent | Present | Present |

TABLE 5

| | | Example 11 | Example 12 | Example 13 | Example 14 | Example 15 | Example 16 | Example 17 |
|---|---|---|---|---|---|---|---|---|
| First heating | Temperature | | | | 260° C. | | | |
| | Pressure | | | | 1 kgf | | | |
| | Time | | | | 60 sec | | | |
| Second heating | Temperature | | | | 180° C. | | | |
| | Pressure | | | | 0 kgf | | | |
| | Time | | | | 60 min | | | |
| Distance X (μm) | | 39 | 42 | 42 | 41 | 44 | 43 | 44 |
| Distance Y (μm) | | 250 | 250 | 250 | 250 | 250 | 250 | 250 |
| Distance Z (μm) | | 40 | 40 | 40 | 40 | 40 | 40 | 40 |
| Conductivity test | Primary stage | ○ | ○ | ○ | ○ | ○ | ○ | ○ |
| | 1000 hours after heat cycle test | ○ | ○ | ○ | ○ | ○ | ○ | ○ |
| Contamination of external electrode | | Absent | Absent | Absent | Absent | Absent | Absent | Absent |

| | | Example 18 | Example 19 | Example 22 | Example 23 | Comp. Ex. 3 | Comp. Ex. 4 |
|---|---|---|---|---|---|---|---|
| First heating | Temperature | | | 260° C. | | 260° C. | |
| | Pressure | | | 1 kgf | | 1 kgf | |
| | Time | | | 60 sec | | 60 sec | |
| Second heating | Temperature | | | 180° C. | | 180° C. | |
| | Pressure | | | 0 kgf | | 0 kgf | |
| | Time | | | 60 min | | 60 min | |
| Distance X (μm) | | 47 | 45 | 47 | 45 | 39 | 56 |
| Distance Y (μm) | | 250 | 250 | 250 | 250 | 250 | 250 |
| Distance Z (μm) | | 40 | 40 | 40 | 40 | 40 | 40 |
| Conductivity test | Primary stage | ○ | ○ | ○ | ○ | ○ | X |
| | 1000 hours after heat cycle test | ○ | ○ | ○ | ○ | X | X |
| Contamination of external electrode | | Absent | Absent | Absent | Absent | Present | Present |

As shown in Tables 4 and 5, in Examples 1 to 23, there was no contamination of external electrode, and semiconductor electronic components satisfying the desired ranges of the distances X, Y and Z were successfully obtained. Further, it is understood that the results of conductivity test are favorable and the obtained semiconductor electronic components are excellent in connection reliability. By mounting the semiconductor electronic component thus obtained on a substrate according to the common method, the semiconductor device of the present invention can be obtained.

On the other hand, in Comparative Examples 1 to 4, each external electrode was contaminated with the adhesive tape, and products, which cannot be electrically connected, and which lack connection reliability, were obtained. Therefore, it was understood that these products cannot be used as a semiconductor electronic component.

Based on the above-described matters, it is understood that, by using the adhesive tape of the present invention, a chip-on-chip type semiconductor device, which provides good electrical connection, and which allows high density mounting of semiconductor chips, can be produced.

INDUSTRIAL APPLICABILITY

When using the adhesive tape of the present invention, electrical connection and filling between semiconductor chips in a semiconductor device can be performed together. By using the adhesive tape of the present invention, a chipon-chip type semiconductor device in which semiconductor integrated circuits are mounted at high density can be provided, and therefore, an electronic component, which can meet requirements for sophistication and miniaturization, can be produced.

The invention claimed is:

1. An adhesive tape for electrically connecting semiconductor chips in a chip-on-chip type semiconductor device, comprising:
(A) 10 to 50 wt % of film forming resin;
(B) 30 to 80 wt % of curable resin; and
(C) 1 to 20 wt % of curing agent, wherein
in the case where a tin-containing solder ball having the diameter of 500 μm is provided on the adhesive tape and heated at a temperature which is 30° C. higher than the melting point of the solder ball for 20 seconds, the solder wet-spreading ratio represented by the following formula (I) is 40% or higher:

Solder wet-spreading ratio (%)=[{(diameter of solder ball)−(thickness of solder after wet spreading)}/ (diameter of solder ball)]×100    (I), in the case where the solder wet-spreading ratio is 60% or higher, the adhesive tape comprises aliphatic dicarboxylic acid as (C) the curing agent,
in the case where the solder wet-spreading ratio is 40% to 60%, the adhesive tape comprises the compound having a carboxyl group and a phenolic hydroxyl group as (C) the curing agent, and
the solder material used in the measurement of the solder wet-spreading ratio is Sn/Ag/Cu=96.5/3.0/0.5.

2. An adhesive tape for electrically connecting a first semiconductor chip and a second semiconductor chip in a chip-on-chip type semiconductor device, wherein the circuit surface of the first semiconductor chip and the circuit surface of the second semiconductor chip are opposed to each other, the adhesive tape comprising:
(A) 10 to 50 wt % of film forming resin;
(B) 30 to 80 wt % of curable resin; and
(C) 1 to 20 wt % of curing agent, wherein
in the case where a tin-containing solder ball having the diameter of 500 μm is provided on the adhesive tape and heated at a temperature which is 30° C. higher than the melting point of the solder ball for 20 seconds, the solder wet-spreading ratio represented by the following formula (I) is 40% or higher:

Solder wet-spreading ratio (%)=[{(diameter of solder ball)−(thickness of solder after wet spreading)}/ (diameter of solder ball)]×100    (I), in the case where the solder wet-spreading ratio is 60% or higher, the adhesive tape comprises aliphatic dicarboxylic acid as (C) the curing agent,
in the case where the solder wet-spreading ratio is 40% to 60%, the adhesive tape comprises the compound having a carboxyl group and a phenolic hydroxyl group as (C) the curing agent, and
the solder material used in the measurement of the solder wet-spreading ratio is Sn/Ag/Cu=96.5/3.0/0.5.

3. The adhesive tape according to claim 1, wherein the film forming resin is at least one substance selected from the group consisting of (meth)acrylic resin, phenoxy resin and polyimide resin.

4. The adhesive tape according to claim 1, wherein the curable resin is epoxy resin.

5. The adhesive tape according to claim 1, wherein the aliphatic dicarboxylic acid is sebacic acid.

6. The adhesive tape according to claim 1, wherein the compound having a carboxyl group and a phenolic hydroxyl group is at least one substance selected from phenolphthalin and gentisic acid.

7. The adhesive tape according to claim 1, wherein, in the case where the thickness of the adhesive tape is 100 μm, the melt viscosity thereof at 223° C. is 10 Pa·s to 200000 Pa·s, wherein the melt viscosity is measured using a viscoelasticity measuring apparatus irate of temperature increase: 30° C./min, frequency: 1.0 Hz, measuring stress by constant distortion), and the viscosity at atmospheric temperature of 223° C., which is the melting point of Sn/Ag=96.5/3.5.

8. A chip-on-chip type semiconductor device, wherein semiconductor chips are electrically connected using the adhesive tape according to claim 1.

* * * * *